(12) United States Patent
Brahlek et al.

(10) Patent No.: US 12,333,384 B1
(45) Date of Patent: Jun. 17, 2025

(54) ELECTRO-OPTICAL CIRCUIT FOR PERFORMING TOPOLOGICAL QUANTUM COMPUTATION

(71) Applicant: UT-Battelle, LLC, Oak Ridge, TN (US)

(72) Inventors: Matthew J. Brahlek, Oak Ridge, TN (US); Eugene Dumitrescu, Oak Ridge, TN (US); Gabor Halasz, Knoxville, TN (US); Chengyun Hua, Knoxville, TN (US); Benjamin J. Lawrie, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 581 days.

(21) Appl. No.: 17/721,645

(22) Filed: Apr. 15, 2022

Related U.S. Application Data

(60) Provisional application No. 63/175,653, filed on Apr. 16, 2021.

(51) Int. Cl.
*G06N 10/40* (2022.01)
*G01R 33/26* (2006.01)

(52) U.S. Cl.
CPC ............. *G06N 10/40* (2022.01); *G01R 33/26* (2013.01)

(58) Field of Classification Search
CPC ........ G06N 10/00; G06N 10/20; G06N 10/40; G06N 10/60; G06N 10/70; G01R 33/26
USPC ........................................................ 716/100
See application file for complete search history.

(56) References Cited

U.S. PATENT DOCUMENTS

| | | |
|---|---|---|
| 6,787,798 B1 | 9/2004 | Andrews et al. |
| 9,713,199 B2 | 7/2017 | Freedman et al. |
| 2020/0167683 A1* | 5/2020 | Frisch ................... G06N 10/40 |
| 2023/0023319 A1* | 1/2023 | Poccia .................. G06N 10/40 |

OTHER PUBLICATIONS

Auslaender, O. et al., "Mechanics of individual isolated vortices in a cuprate superconductor", Nature Physics, Jan. 2009, pp. 35-39, vol. 5, No. 1.

Ge, J. et al., "Nanoscale assembly of superconducting vortices with scanning tunnelling microscope tip", Nature Communications, Dec. 2016, pp. 1-7, vol. 7, No. 1.

Nayak, C. et al., "Non-Abelian anyons and topological quantum computation", Reviews of Modern Physics, 2008, pp. 1083-1159, vol. 80, No. 3.

(Continued)

*Primary Examiner* — Paul Dinh
(74) *Attorney, Agent, or Firm* — Scully, Scott, Murphy & Presser, P.C.

(57) ABSTRACT

A quantum processing device having a type II superconducting medium is provided. Majorana-carrying vortices may be created at some of the defects in the medium by a magnetic flux source. Once created, one or more vortices may be depinned from its departure location, dragged through the medium and repined at a destination location, respectively. One or more laser beams may be respectively used for moving the vortices. The power of the laser beams may be independently controlled. The vortices may be moved for readout and/or for computation, as needed, such as for providing quantum computational gates.

24 Claims, 14 Drawing Sheets
(13 of 14 Drawing Sheet(s) Filed in Color)

(56) References Cited

OTHER PUBLICATIONS

Xu, G. et al., "Topological superconductivity on the surface of Fe-based superconductors", Physical Review Letters, 2016, pp. 1-5, vol. 117, No. 4.

Fu, L. et al., "Superconducting proximity effect and majorana fermions at the surface of a topological insulator", Physical Review Letters, 2008, pp. 096407-1 to 096407-4, vol. 100, No. 9.

Fu, X. et al., "Optical manipulation of magnetic vortices visualized in situ by Lorentz electron microscopy", Science Advances, 2018, pp. 1-11, vol. 4, No. 7.

Villegas, J. et al., "A superconducting reversible rectifier that controls the motion of magnetic flux quanta", Science, Nov. 2003, pp. 1188-1191, vol. 302, No. 5648.

November, B. et al., "Scheme for Majorana Manipulation Using Magnetic Force Microscopy", arXiv:1905.09792 [cond-mat], 2019.

Polshyn, H. et al., "Manipulating multivortex states in superconducting structures", Nano letters, 2019, pp. 5476-5482, vol. 19, No. 8.

Kremen, A. et al., "Mechanical control of individual superconducting vortices", Nano Letters, 2016, pp. 1626-1630, vol. 16, No. 3.

Veshchunov, I. et al., "Optical manipulation of single flux quanta", Nature Communications, 2016, pp. 1-7, vol. 7, No. 1.

Knapp, C. et al., "The nature and correction of diabatic errors in anyon braiding", Phys. Rev. X, 2016, pp. 041003-1 to 041003-38, vol. 6.

Lian, B. et al., "Topological quantum computation based on chiral Majorana fermions", PNAS, Oct. 23, 2018, pp. 10938-10942, vol. 115, No. 43.

Harper, F. et al., "Majorana braiding in realistic nanowire Y-junctions and tuning forks", Physical Review Research, 2019, pp. 033207-1 to 033207-16.

Ma, X. et al., "Braiding Majorana Fermions and Creating Quantum Logic Gates with Vortices On a Periodic Pinning Structure", 2019, arXiv:1910.07033v1.

\* cited by examiner

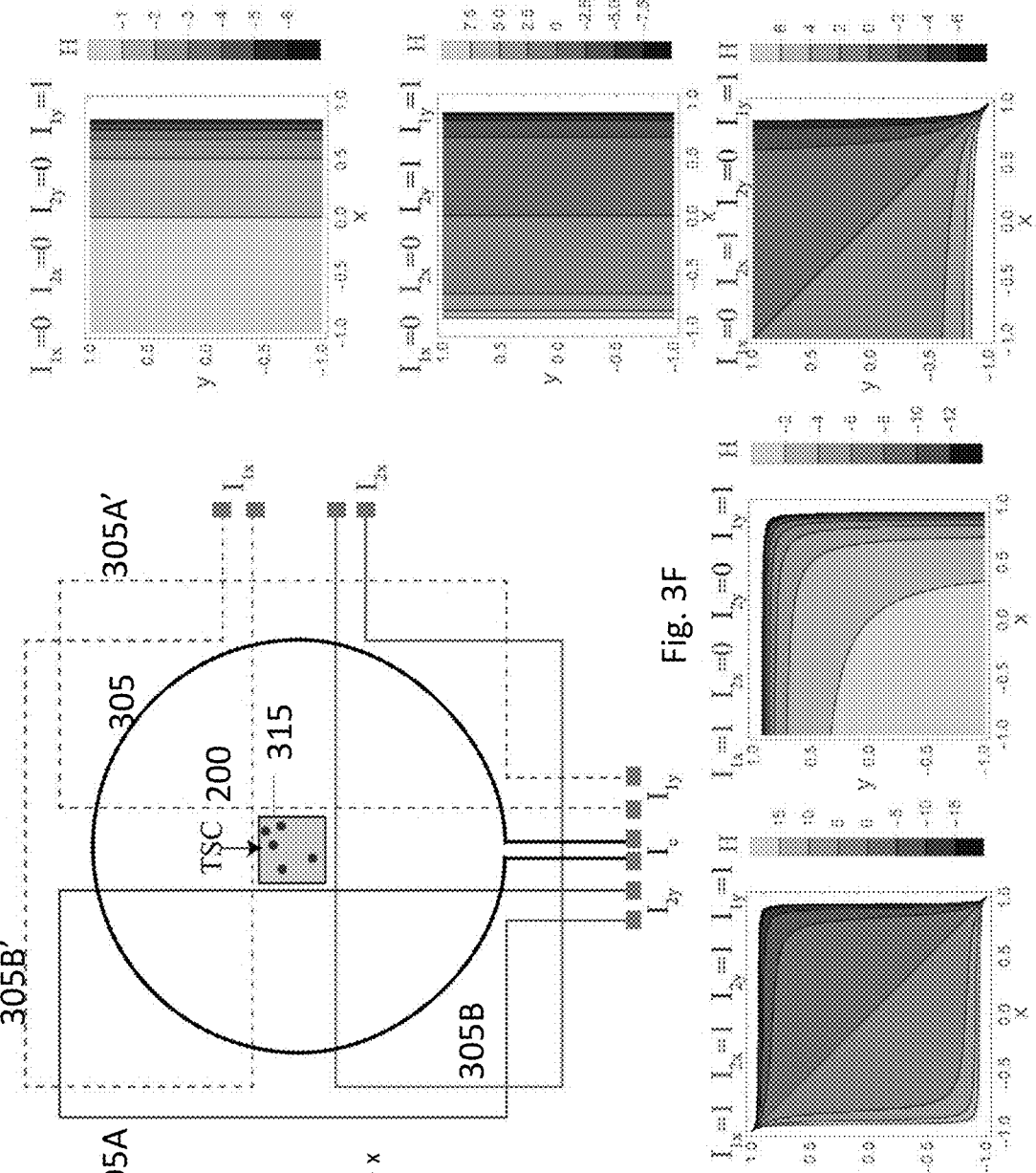

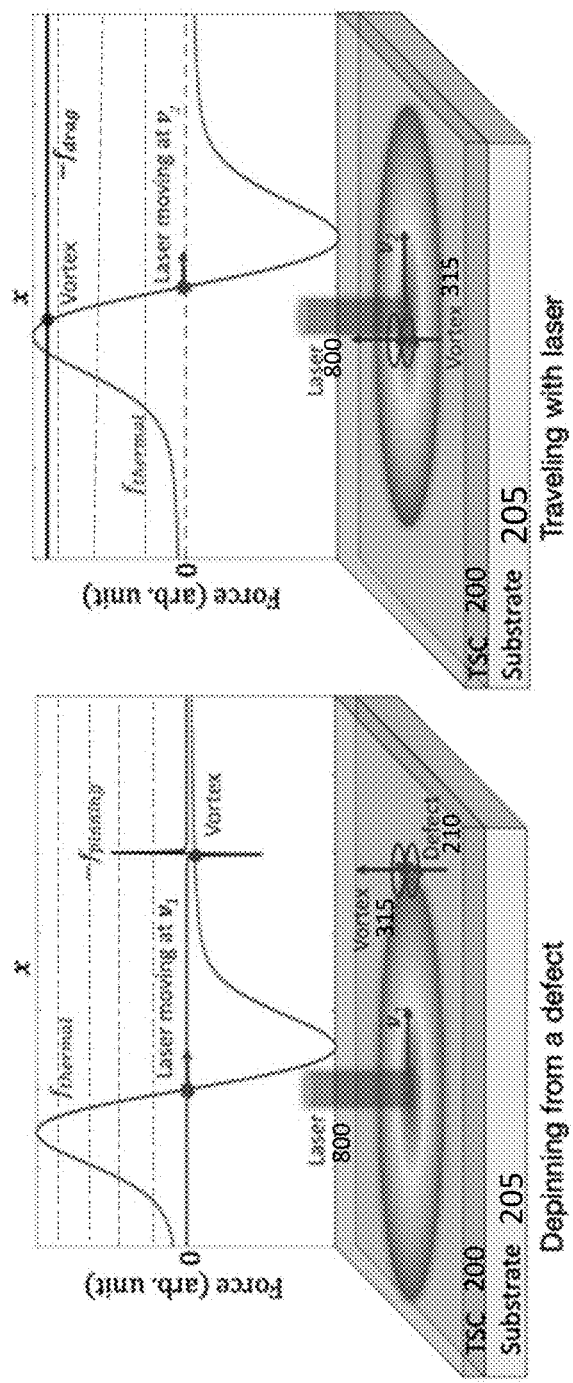

ELECTRO-OPTICAL CIRCUIT FOR PERFORMING TOPOLOGICAL QUANTUM COMPUTATION

CROSS-REFERENCE TO RELATED APPLICATIONS

This application claims the benefit of and priority to U.S. Provisional Application Ser. No. 63/175,653 filed on Apr. 16, 2021, the entirety of which are incorporated by reference.

STATEMENT REGARDING FEDERALLY SPONSORED RESEARCH

The United States Government has rights in this invention pursuant to contract no. DE-AC05-00OR22725 between the United States Department of Energy and UT-Battelle, LLC.

FIELD OF THE DISCLOSURE

This disclosure relates to quantum computation. More specifically, the disclosure relates to the creation of Majorana-carrying vortices in a superconducting medium and movement of the vortices for reading and computation.

BACKGROUND

Quantum computation is performed using operations on quantum mechanical superpositions of such states. Such operations use quantum bits, called qubits, that are sufficiently isolated, such that logical operations can be performed before the quantum states of the qubits collapse through deleterious interactions with the environment. Therefore, in order for a system to be viable for use in quantum computation, the medium must provide topological protection such that the qubit is physically immune to the deleterious interactions with the environment.

Conventional qubit platforms range from superconducting Josephson junctions to semiconductor-based spin-qubits. Both technologies have matured sufficiently a handful of for quantum operations to be performed with minimal decoherence effects interfering with the computational process. Thus far the qubits number is limited, but growing, and the environment is confined to extremely low temperatures, of order a few millikelvin. In terms of scaling the number of logical qubits to a requisite number, however, the standard qubits following the quantum error correcting paradigm face a large resource overhead in terms of overcoming decoherence effects.

SUMMARY

Accordingly, disclosed is a quantum processing device comprising a type II superconducting medium, a magnetic flux source, a laser source and a beam-steering module. The type II superconducting medium may comprise a plurality of defects. The magnetic flux source may be configured to produce a magnetic flux to induce within the type II superconducting medium, vortices pinned at locations of some of the defects, such that the vortices are separated from each other based on a vortex distribution. Two or more vortices are used to enact quantum computational gates of the quantum processing device. The laser source may be configured to provide two or more laser beams with controllable power. The beam-steering module may be configured to redirect the two or more laser beams to departure locations of two or more vortices while the two or more laser beams are provided with a first power that causes unpinning of the two or more vortices from the departure locations, respectively. The two or more laser beams to drag the unpinned vortices through the type II superconducting medium. The beam-steeping module may be further configured to sweep the two or more laser beams along respective paths from the departure locations to destination locations of the two or more vortices, and redirect the two or more laser beams to the destination locations while the two or more laser beams are provided with a second power smaller than the first power that causes pinning of the dragged vortices.

The magnetic flux source may be configured for a controllable flux magnitude. In other aspects, the magnetic flux source may provide a fixed magnetic flux. The magnetic flux may be homogenous or inhomogeneous. In some aspects, the magnetic flux source may comprise at least one wire and corresponding current source. The magnitude of the magnetic flux may be controlled based on a target number of vortices and the vortex distribution. In other aspects, the magnetic flux source may comprise a plurality of wires and current sources. Each current source may be independently controllable. The plurality of wires may be positioned with respect to the type II superconducting medium to produce an asymmetric magnetic flux within the type II superconducting medium. In an aspect of the disclosure, the vortex distribution is such that adjacent vortices are separated by about 1 μm to about 100 μm. Each vortex may have a spin orbit of about 0.1 μm in diameter.

The quantum processing device may further comprise material positioned over the type II superconducting medium and a device configured to determine a position and number of the vortices within the type II superconducting medium and transfer the position and number to a processor.

In an aspect of the disclosure, the beam-steering module may be configured to enact one or more quantum computational gates by braiding two or more vortices. In this aspect of the disclosure, the beam-steering module may be configured to redirect a first laser beam to a first location of a first vortex and a second laser beam to a second location of a second vortex while the first and second laser beams are provided with the first power, sweep the first laser beam along a first path from the first location to the second location and the second laser beam along a second path from the second location to the first location, and redirect the first laser beam to the second location and the second laser beam to the first location while the first and second laser beams are provided with the second power. In other aspects, the braiding may be accomplished by the beam-steering module redirecting a laser beam to a location of a first vortex, sweeping a power of the laser beam to depin the first vortex and sweeping the laser beam along a loop-shaped path from the location of the first vortex encircling a second vortex a single time and back to the location of the first vortex and ramping the power down to repin the first vortex.

In an aspect of the disclosure, the device may further comprise a processor configured to instruct the beam-steering module to enact the one or more quantum computational gates based on a computation.

In an aspect of the disclosure, the laser source may comprise a laser and a plurality of beam splitters to provide the two or more laser beams. The laser beams may be moved at a speed of in a range of 0.5 to 0.5 cm/s. The laser beams may have a diameter of about 1 μm.

In an aspect of the disclosure, the type II conducting medium may be a superconducting film disposed on a substrate. The film may comprise a mixtures of Fe with one or more heavy elements such as Fe(Te,Se). The substrate may comprise $SrTiO_3$. In other aspects, the film may comprise $Cu-Bi_2Se_3$ and the substrate may comprise InP. In other aspects, the film may comprise BiPd and the substrate may comprise $Al_2O_3$. In an aspect of the disclosure, the magnetic flux source may be disposed on the substrate.

In an aspect of the disclosure, the type II superconducting medium may be part of a $NbSe_2/Bi_2Se_3$ heterostructure.

In an aspect of the disclosure, the beam-steering module may be configured to move the vortices for readout. In this aspect, the beam-steering module may redirect the two laser beams to departure locations of two vortices while the two laser beams are provided with the first power that causes unpinning of the vortices from the departure defects, respectively, and allows the two laser beams to drag the unpinned vortices through the type II superconducting medium toward a readout module and each other to cause fusing of the two vortices for readout and return the two vortices to respective departure locations after readout.

In other aspect of the disclosure, disclosed is a quantum processing device comprising a type II superconducting medium, a magnetic flux source, a laser source and a beam-steering module. The type II superconducting medium may comprise a plurality of defects. The magnetic flux source may be configured to produce a magnetic flux to induce within the type II superconducting medium, vortices pinned at locations of some of the defects, such that the vortices are separated from each other based on a vortex distribution. Two or more vortices are used to enact quantum computational gates of the quantum processing device. The laser source may be configured to provide a laser beam with controllable power. The beam-steering module may be configured to redirect the laser beam to a departure location of a vortex while the laser beam is provided with a first power that causes unpinning of the vortex from the departure location, sweep the laser beam along a path from the departure location to a destination location, and redirect the laser beam to the destination location while lowering the power from the first power level to a second power level to cause pinning of the dragged vortex.

The path may comprise encircling another vortex a single time to braid. The departure location may be the same as the destination location.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

FIG. 3AA illustrates an example of a vortex imager in accordance with aspects of the disclosure;

FIG. 3B illustrates another example of a wire pattern with respect to a topological superconductor to generate a magnetic field for initialization of vortices in accordance with other aspects of the disclosure;

FIGS. 3C-3G illustrate examples of different magnetic field distributions which may be generated using the wire pattern shown in FIG. 3B;

FIGS. 8A-8C illustrate competing forces for three different stages of movement in accordance with aspects of the disclosure;

DETAILED DESCRIPTION

In accordance with aspects of the disclosure, Majorana-carrying vortices (vortices) are induced or created in a topological superconducting medium by using a magnetic field. Note that the topological superconducting medium is referred simply as a topological superconductor (TSC). 2N vortices are required to form N−1 qubits; where the quantum states are represented as world-lines of Majorana zero-modes (also called Majorana Fermions or simply Majoranas) which are carried by their parent vortices. The fact that the braids of the vortices' space-time paths are robust to small perturbations reflects the topological protection. Quantum computations operations may be performed by exchanging (moving) the vortices such as via a braiding operation. The braiding operation may comprise thermally depinning (also referred to as unpinning) first and second vortices from first and second positions, respectively, and dragging the first and second vortices through a portion of the TSC along first and second paths, respectively, and pinning (also referred to as re-pinning) the first and second vortices in the exchanged second and first positions, respectively. Alternatively, the braiding exchange operation may include thermally depinning a first vortex from a first position, dragging the first vortex through a portion of the TSC along a path around a second vortex pinned at a second location, and re-pinning the first vortex back in the first original position.

Figure 1:
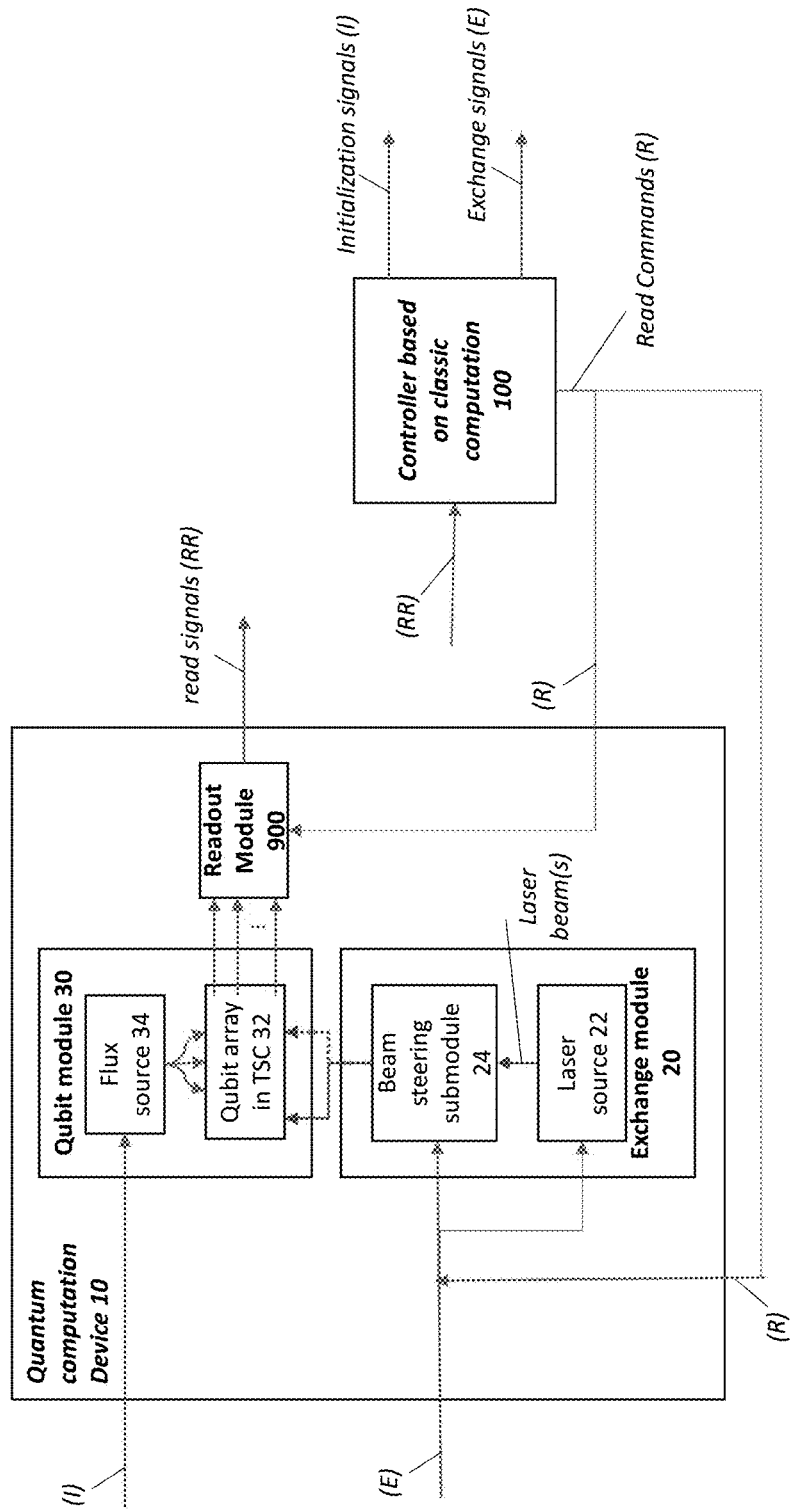
FIG. 1 illustrates a quantum computation system in accordance with aspects of the disclosure.

FIG. 1 illustrates a quantum computation system 1 in accordance with aspects of the disclosure. The system 1 may comprise a quantum computation device 10 and a controller 100. The quantum computation device 10 can perform quantum calculations with qubits, which can represent both the "0" and the "1" of binary information simultaneously. In contrast, the Controller 100 can perform classic computations, which can represent either the "0" or the "1" of binary information at a single time.

The quantum computation device 10 may comprise an exchange module 20 and a qubit module 30. The exchange module 20 may be configured to execute the braiding operation to move one or more vortices based on an exchange signal E. The exchange module 20 may also be configured to move pairs of vortices based on an exchange signal (E) close to a readout module 900 for reading and fusing. The exchange module 20 may comprise a laser source 22 and a beam steering submodule 24.

In an aspect of the disclosure, the laser source 22 may comprise a plurality of independently controllable lasers. Each laser produces a single laser beam. The power level of each laser may be independently controlled by a controller (not shown in FIG. 1). Each laser may be tuned to output a predefined wavelength. The wavelength of the lasers may be based on the materials used for the TSC 200 and thermal properties of the TSC 200 including an absorption spectrum and resonance.

In other aspects of the disclosure, a single laser may be used to seed a plurality of laser beams. In this aspect of the disclosure, the laser source may further comprise an array of beam splitters (BS). The array of BS may be configured to produce a plurality of beams from the single laser. The number of beams may be based on the number of vortices needed to be simultaneously moved. In other aspects of the disclosure, a 1 to X beam splitter may be used.

For example, in some aspects of the disclosure, two vortices may be moved at the same time (using two beams). In other aspects of the disclosure, four vortices may be moved at the same time (using four beams). In other aspects of the disclosure, X vortices may be moved at the same time (using X beams), where $X \geq 2$ is an integer. In an aspect of the disclosure, one vortex may be wrapped around another (one vortex moved).

In other aspects of the disclosure, a diffractive grating may be used to produce a plurality of beams from the single laser source.

In an aspect of the disclosure, when the single laser is used to seed the plurality of laser beams, the power of each beam may be independently controlled using an array of filters, such as ND filters positioned in the path of the beam downstream of the respective BS and upstream of the beam steering submodule 24 (also referred to as beam steering module). In FIG. 1, single arrow is shown to represent the "laser beam" output from the laser source 22 for illustrative purposes, however, X beams may be output. Each filter may be placed on a rotational stage which is controlled to a specific attenuation by a controller. Other optics may be used to independently control the power of the beam independently.

When a plurality of lasers is used to provide the plurality of laser beams, a controller may independently control the power of the laser (wattage) to provide the desired power level for the respective laser beam.

In an aspect of the disclosure, the beam steering submodule 24 may comprise an array two-axis micromirrors. Each of the micromirrors in the array may be independently controllable by a controller. The respective laser beams may be steered by a respective mirror using the controller. This allows for controlling the laser beam to be positioned at a defect that pins a vortex to unpin the vortex, drag the vortex and re-pin the vortex at the same or another defect as described below.

The micromirror array may be MEMS and the angle(s) of the mirror may be determined by an applied voltage. The MEMS micromirror may be piezoelectric.

In other aspects of the disclosure, solid-state laser mirrors (array) may be used to independently steer the laser beams, respectively.

The qubit module 30 may comprise a qubit array 32 formed in a TSC 200 and a flux source 34. The qubit module 30 may be located in a cryo-cell or cryo-chamber. The qubit module 30 may be held in place by a sample holder within the cryo-cell or cryo-chamber.

Figure 2:
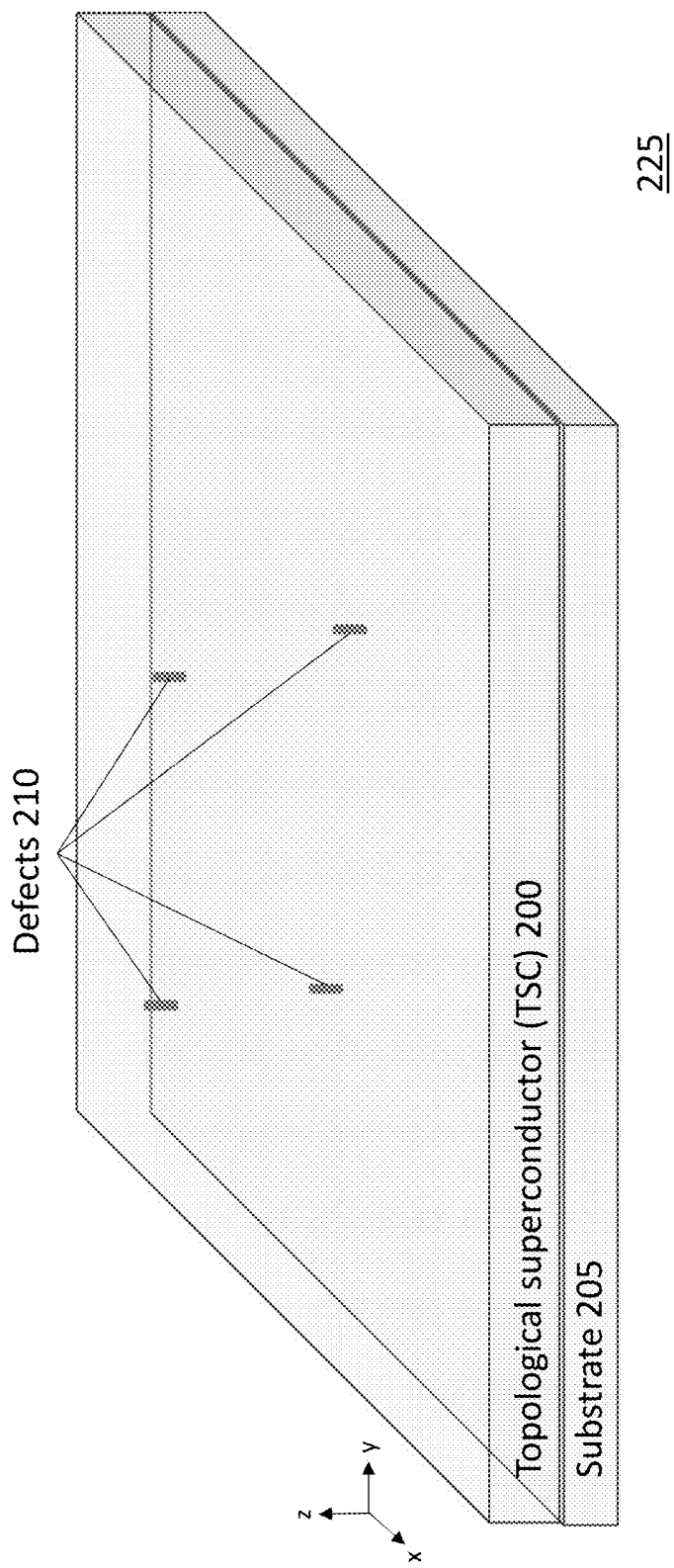
FIG. 2 illustrates an example of a medium for a qubit array in accordance with aspects of the disclosure.

FIG. 2 illustrates an example of a medium 225 (also referred to as the structure 225) for the qubit array 30 in accordance with aspects of the disclosure. The structure 225 may comprises a TSC 200 and a substrate 205. The TSC 200 may naturally (intrinsic) have defects 210. The defect may be a vacancy or an impurity. In other aspects, the defects 210 may be controllably implanted into a TSC 200 using doping. The artificial defects may be cylindrical voids or electrically gated regions. Typically, an artificial defect may be larger in size than the intrinsic defect.

In some aspects of the disclosure, the TSC 200 may be formed as a film on the substrate 205 from a Type 2 superconducting material. This allows for quantized flux lines of a magnetic field (external field, described herein) H, to penetrate the superconductor when $T<T_C$ and when $H_{C_1}<H<H_{C_2}$. $H_{C_1}$ is a magnetic field strength above which vortices may be grown in the defects 210 in the TSC 200. $H_{C_2}$ is a magnetic field strength above which the external field H penetrates throughout the bulk of the structure 225, not only at sites of the defects 210, and destroys the superconductivity of the TSC 200, therefore making it impossible to sustain vortices.

The TSC 200 may comprise one or more elements. For example, the TSC 200 may comprise a mixture of Fe and one or more "heavy elements" with strong spin-orbit coupling. Heavy elements used herein refers to elements above number 37 but are not radioactive. The heavy elements include, but are not limited to, Te, Se. Other elements may be used such as bismuth (Bi). The substrates may be dielectrics or metals. For example, the dielectric substrate 205 may be $SrTiO_3$. In other aspects of the disclosure, the TSC 200 may comprise $Cu-Bi_2Se_3$ and the substrate 205 may comprise InP or $Al_2O_3$. In other aspects of the disclosure, the TSC 200 may comprise BiPd and the substrate 205 may comprise $Al_2O_3$. In yet another aspect of the disclosure, both the TSC 200 and the substrate 205 may comprise a $NbSe_2$ $Bi_2Se_3$ as a heterostructure.

In accordance with aspects of the disclosure, vortices 315 may be initially positioned at defect sites 210, where the free energy is minimized using a magnetic field. A vortex 315 is formed around quantized flux lines.

For purposes of the description, as shown in FIG. 2, the x and y axes are planar to the TSC 200 and the z-axis is perpendicular.

In an aspect of the disclosure, the TSC 200 may be about 100 nm thick in the z-direction. The TSC 200 may comprise a monolayer. In other aspects, the TSC 200 may be formed as two monolayers.

The flux source 34 may comprise a controller, a current source and one or more wires (coils). The controller may be configured to control the current flowing through the one or more wires to generate a magnetic field.

Figure 3A:
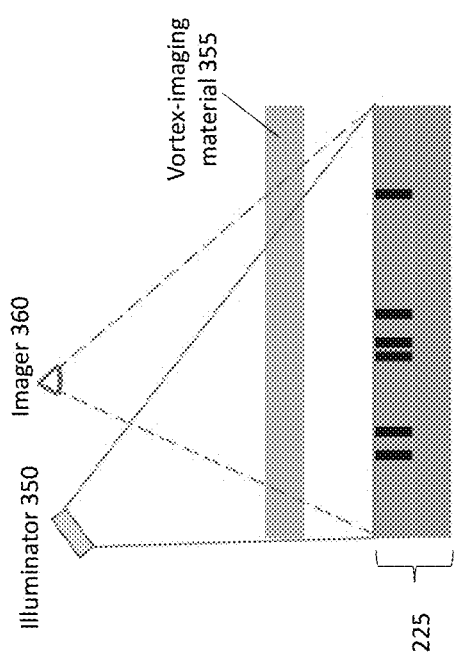
FIG. 3A illustrates an example of a wire pattern with respect to a topological superconductor to generate a magnetic field for initialization of vortices in accordance with aspects of the disclosure.
Figure 3A:
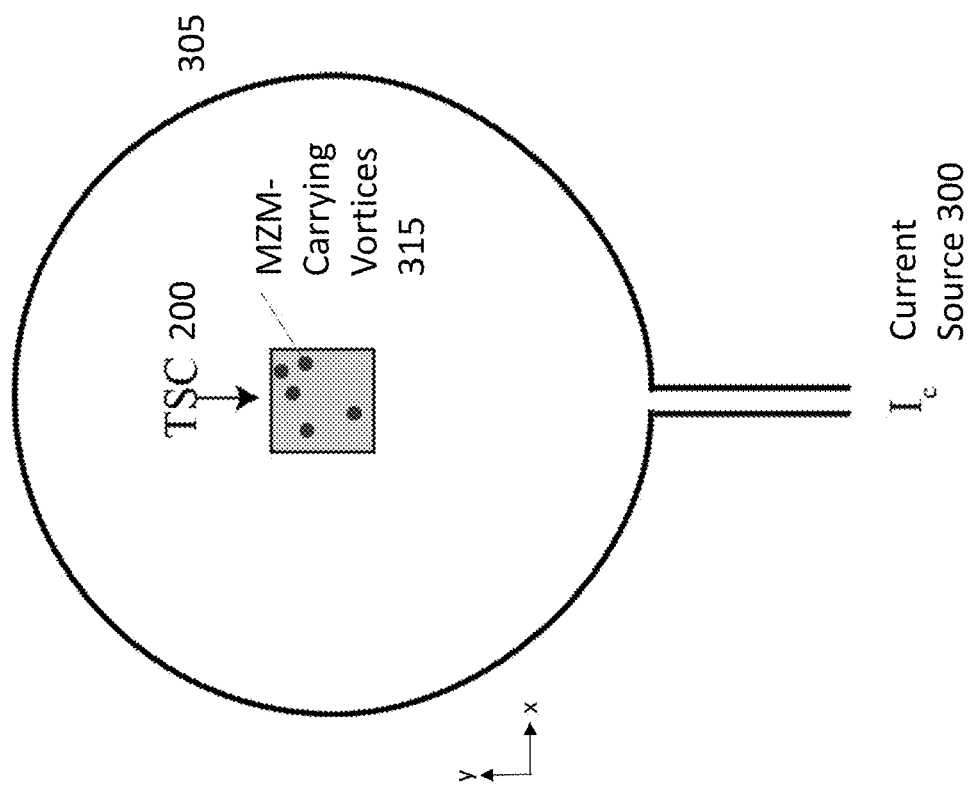

FIG. 3A shows an example of arrangement of a wire 305 with respect to the TSC 200 used to generate a magnetic field in accordance with aspects of the disclosure. In an aspect of the disclosure, the wire 305 may be configured to generate a homogeneous magnetic field perpendicular to the TSC 200. The direction of the field, e.g., up or down (when the TSC 200 is horizontal) may be based on the direction of the current flow within the wire. In some aspects, the wire may be a coil with a plurality of turns. In other aspects, the wire may be a single layer. In an aspect of the disclosure, the wire may be positioned within the cryo-cell or cryo-chamber. For example, the wire may be attached to the same substrate 205 that the TSC 200 is disposed onto (e.g., on-chip). The wire 305 may generate a magnetic field between $H_{C_1}<H<H_{C_2}$. $H_{C_1}$, $H_{C_2}$ may be dependent on the material(s) used for the TSC 200. On-chip wires may be used when $H_{C_1}$, $H_{C_2}$ are relatively low (on the order of oersteds), such as 0.1 to 20 Oe. The current source 300 may be configured to generate currents on the order of microamps or milliamps when used with an on-chip coil.

In other aspects, the coil may be positioned around the TSC 200 but separate. In other aspects of the disclosure, an electromagnet may be positioned outside the cryo-cell or cryo-chamber. Even though the electromagnet may be external to the cryo-cell, the electromagnet still is able to provide a controllable magnetic field perpendicular to the TSC 200 of a sufficient strength to grow Majorana zero mode (MZM) $\gamma_n$-carrying vortices 315. An electromagnet may be used when $H_{C_1}$, $H_{C_2}$ are relatively high such as on the order of 1T. The current source 300 may be configured to generate currents $I_c$ on the order of milliamps or 100s of amps when used with an electromagnet either external to the cryo-cell or separate from the substrate 205.

In an aspect of the disclosure, the magnetic field may be generated to be closer to $H_{C_1}$ than $H_{C_2}$. In some aspects, the magnetic field may be within 10% of $H_{C_1}$. In some aspects, the strength of the magnetic field may be based on a target number of MZM $\gamma_n$-carrying vortices 315. An MZM $\gamma_n$ is found at each vortex core. For purposes of the description MZM and vortex may be used interchangeably. The higher the magnetic field, the more vortices 315 may be grown.

In some aspects, to initialize the vortices, the controller may control the current source 300 to produce a current to generate a magnetic field slightly above $H_{C_1}$. Afterwards, an image may be obtained of the TSC 200, by an imaging system as illustrated in FIG. 3AA, for instance. The image may be obtained by placing a material 355 over the TSC 200 and illuminating the same by an illuminator 350. The material 355 senses a magnetic flux at the vortices 315. In some aspects, the material 35 may be an inductor. The inductor may be a garnet. For example, the material 355 may be a Bi:LuIG garnet of composition $Lu3-xBi_xFe_{5-z}Ga_zO_{12}$ with x~0.9 and z~1.0 grown by liquid phase epitaxy on a (100) oriented paramagnetic gadolinium-gallium-garnet $Gd_3GaO_{12}$ substrate. In an aspect of the disclosure, the material 355 may have a high Verdet constant on the order of ~0.01 $\mu m^{-1} mT^{-1}$ at the laser wavelength of interest. In an aspect of the disclosure, the illuminator 350 may be a laser configured to emit a certain wavelength. The wavelength may be set to give a maximum Verdet constant. The laser may be scanned across the TSC 200 (x and y directions). The imager 360 may comprise a polarizer and a photodiode. The laser has a preset polarization. When the laser is reflected from a local spot on the indicator, the polarization of the reflected light will be slightly changed due to a local dielectric constant change (the vortex region generates a weak magnetic field which changes the local dielectric constant of the indicator at that position). The polarization change is detected from the polarizer (converts the polarization change into an intensity signal). The intensity signal is read by the photodiode. When illuminated by illuminator 350, the position and number of vortices 315 may be seen on an imager 360. If a target number of vortices has been reaches, no further magnetic field may be needed. On the other hand, when the target number of vortices has not been reaches, the controller may increase the current provided by the current source 300 to increase the strength of the magnetic field and repeat the imaging to determine the position and number of vortices (until a target number is reached).

In an aspect of the disclosure, if the grown vortices 315 are not in a target position, the vortices 315 may be moved and positioned in a target position as described herein.

In other aspects of the disclosure, the position of the vortices 315 may be controlled during the growing process using additional wires 305N (where N is the number of addition wires). The additional wires may be used to create a customizable inhomogeneous magnetic field distribution. The customizable field may be used separate from the above field or in addition to the same. An inhomogeneous magnetic field distribution may be used to generate a corresponding inhomogeneous vortex distribution. The number of additional wires and position of the wires may be based on a target vortex distribution.

FIG. 3B shows another example of arrangement of wire pattern with respect to the TSC 200 to generate a magnetic field in accordance with aspects of the disclosure. In FIG. 3B, there are five wires 305, 305A, 305A', 305B, and 305B'. Wire 305 may be the same wire as described above. Wire 305A and 305A' may be symmetric with respect to the TSC 200. Wire 305B and 305B' may be symmetric with respect to TSC 200. The wire pattern shown in FIG. 3B is only an example for descriptive purposes and other wire patterns and number of wires may be used. As described above, each wire 305, 305A, 305A', 305B, and 305B' may be positioned on the same substrate 205 as the TSC 200, especially when $H_{C_1}$, $H_{C_2}$ are relatively low (on the order of oersteds), such as 0.1 to 20 oe. In other aspects, as described above, the wires may be part of an electromagnetic external to the cryo-unit. Additionally, the electromagnet may be positioned within the cryo-unit but separate from the TSC 200.

Current may be selectively supplied to each wire independently to generate the customized magnetic field distribution to in turn create a customizable vortex position distribution during initialization. Current $I_{2y}$ may be supplied to wire 305A; current $I_{1y}$ may be supplied to 305A'; current $I_{2x}$ may be supplied to 305B; and current $I_{1x}$ may be supplied to 305B'. The same current source 300 may be used for all of the currents. In other aspect, individual current sources 300 may be separately connected to each wire.

In an aspect of the disclosure, the magnitude of the current supplied to each wire may be independently varied as need to create the target number and position for the vortices 315 (both in magnitude and ON/OFF).

FIGS. 3C-3G illustrate examples of different magnetic field distributions which may be generated using the example wire pattern. In each figure, current I being 0 means that the current is OFF to a particular wire and current I being 1 means that the current is ON to a particular wire. In each figure, the current to wire 305 is ON. The center of the TSC 200 is at the origin in each of FIGS. 3C-3G (x=0, y=0).

For example, as shown in FIG. 3C, the current to wire 305A' is ON ($I_{1y}$=1), while the others are OFF. Therefore, the magnetic field is strongest on the right side of the TSC 200 (in this view). FIGS. 3C-3G show that different magnetic field distributions at the TSC 200 may be achieved using different current patterns.

Similar to above, the number and positions of the vortices 315 may be determined by imaging and the number of vortices 315 may be controlled to reach a target number by iteratively applying an increasing magnetic field and imaging.

Even though using the customizable magnetic field distribution creates a greater positional control over the position of the vortices 315 than a homogeneous magnetic field, the position of certain vortices may still not be in a target position. Therefore, in accordance with aspects of the disclosure, the positions may be moved as described herein.

In an aspect of the disclosure, two vortices may be separated by about 1 µm to 100 µm or more (when pinned). Each vortex $\gamma_n$, where n represents the vortex number, may have a spin-orbit with a diameter of about 0.1 µm, which is one order of magnitude or less than the separation distance.

In other aspects of the disclosure, the magnetic field may be generated by a permanent magnet. The permanent magnet may be positioned above or below the TSC 200. The permanent magnet may be located within the cryo-unit.

Further, as part of the initialization process (or separate), the computation basis states of pairs of vortices may be read as described herein.

Figure 4:
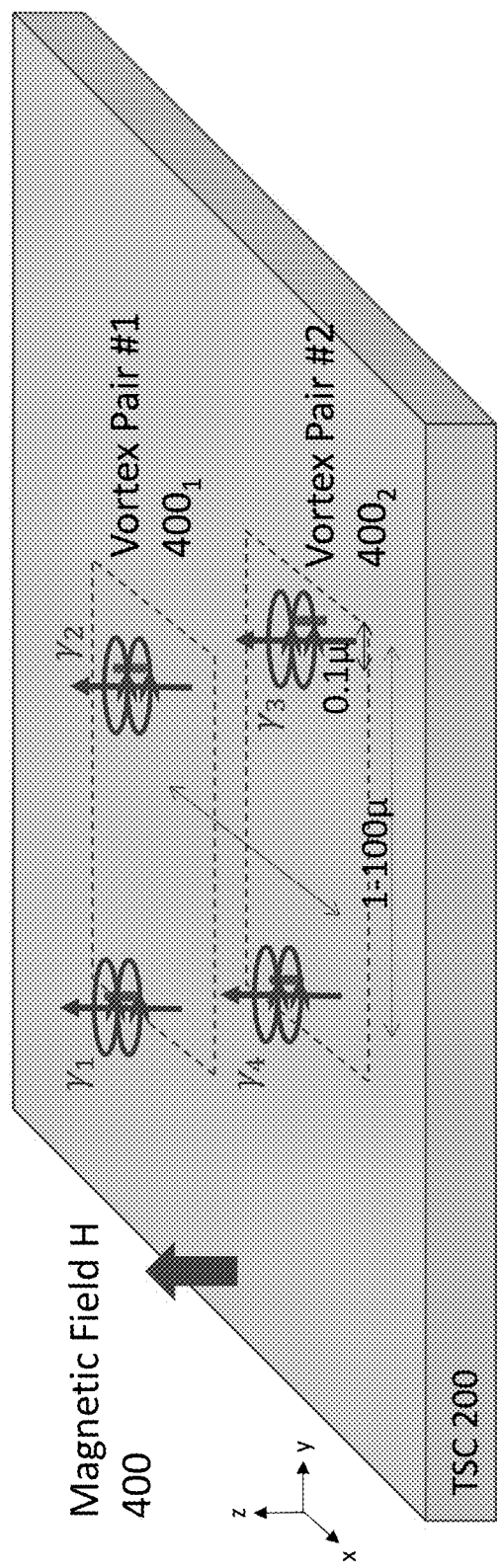
FIG. 4 illustrates an example of qubits formed from pairs of Majorana zero modes in accordance with aspects of the disclosure.

FIG. 4 shows an example of two Pairs of vortices (Vortex Pairs) 400$_1$ and 400$_2$ formed from pairs of MZMs. $\gamma_1$, $\gamma_2$ and $\gamma_3$, $\gamma_4$. Vortices may be assigned to qubits. A qubit has as computational basis states: an occupied fermionic orbital ($|1>$) or an unoccupied ($|0>$) fermionic orbital.

Figure 5:
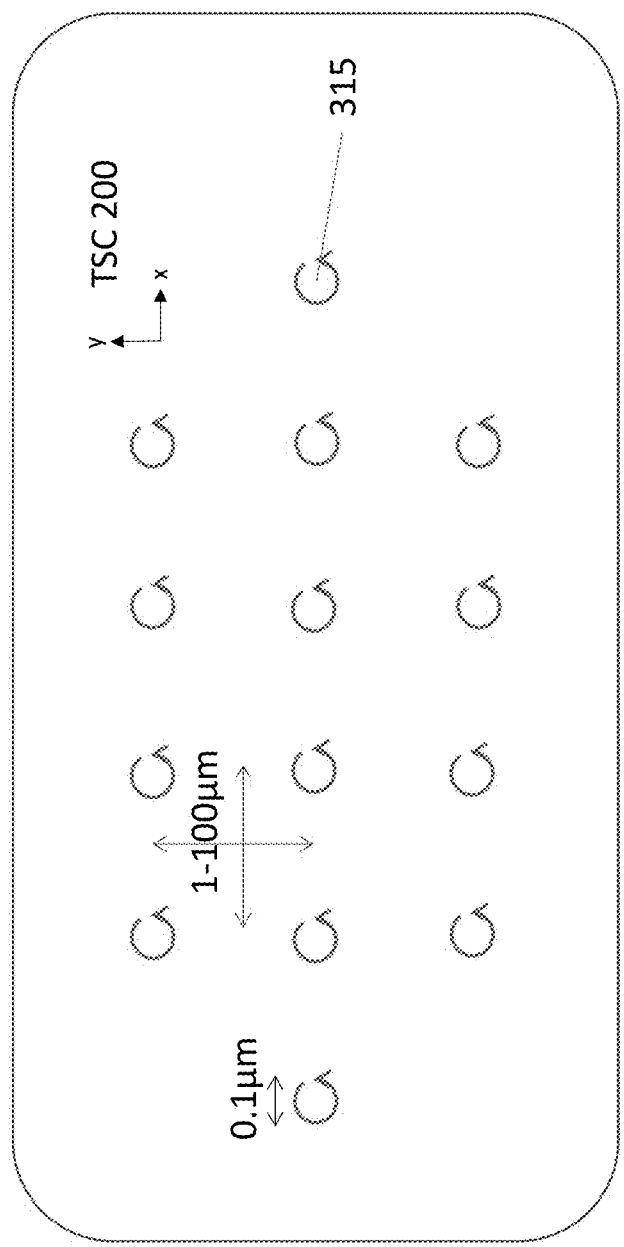
FIG. 5 illustrates an example of a qubit array in accordance with aspects of the disclosure.

FIG. 5 shows an example of 6qubit array having 14 vortices. A computations basis can be chosen by pairing the 14 vortices into 7 fermions and that one of these fermionic degrees of freedom will depend on the others such that the computation takes place in a 6-qubit/fermion space A vortex may be braided with other vortices to enact single or multi-qubits gates as explained below. FIGS. 4, 5 also show an example of a range of distances between vortices and the size of a spin orbit, although the latter is not represented to scale relative to the former. FIGS. 4, 5 show the vortices 315 relatively aligned, however, in practice, the vortices 315 need not be perfectly aligned.

In accordance with aspects of the disclosure, the vortices 315 may be moved by thermal forces (heating) to a desired position. The movement may be for reading the initial states of the vortices 315 and exchanging (braiding, fusing, etc.).

Moving a vortex 315 may comprise three actions. Depinning/unpinning (picking up a vortex 315 from its current pinning site), dragging (transporting the vortex 315 across the bulk of the TSC 200 and pinning/re-pinning (fixing or delivering the vortex to a target pinning site). A pinning site is also referred to a defect 210. At a vortex 315, superconductivity is suppressed within a region of size r.

The position of a vortex 315 x(t) may be defined by the following equation of motion:

$$0 = -\eta \dot{x} - \frac{dU(x)}{dx} + \gamma \frac{dT(x-vt)}{dx} \quad (1)$$

In EQ. 1, $\eta$ is a viscous drag coefficient, U is a pinning energy, and T is a temperature.

This equation assumes that the laser source 22 which causes the heating may move with a constant speed $\dot{x} \equiv v$. The laser source 22 provides a beam with a beam size approximately one order of magnitude larger than the size as the spin orbit. Thus, the laser source 22 provides a "hot spot" approximately 10× larger than the size as the spin orbit. The above equation also assumes that the hot spot meets the pinning site (defect) head on.

Thus, the position of the vortex may be defined with respect to three force, e.g., a viscous drag force ($F_{drag}$), a stationary pinning force ($F_{pinning}$), and a time-dependent thermal force resulting from the hot spot ($F_{thermal}$). The three actions are based on balancing these forces. For example, depinning is a function of the time-dependent thermal force and the stationary pinning force. Dragging is a function of the time-dependent thermal force and the viscous drag force and pinning once again is a function of the stationary pinning force and the time-dependent thermal force.

The left-hand side of EQ. 1 is set to zero because the inertial mass of the vortex 315 is negligibly small at the relevant length and speed scales. The first term on the right side of the equation relates to a viscous drag force. In some aspects, $\eta$ may be determined from a model such as Bardeen-Stephen model. For example, the following equation may be used:

$$\eta = \frac{\Phi_0^2}{2\pi \xi^2 \rho_n} \quad (2)$$

where $\xi$ is the coherence length and $\rho_n$ is the normal-state resistivity and where $\Phi_0 = h/(2e)$ is the flux quantum.

The second term on the right side of EQ. 1 relates to the stationary pinning force. The pinning potential U(x) has a characteristic length scale d and a single minimum at x=0 corresponding to the pinning energy per unit length along the vortex line: $U_0 \equiv -U(0)$. For a pinning site of radius r, the length scale is expected to be d~max ($\xi$,r), while the pinning energy (per unit length) for a cylindrical void may be $U_0 \sim \Phi_0^2/(\mu_0 \lambda^2 \xi^2) \min(r^2, \xi^2)$, where $\mu_0$ is the vacuum permeability, and $\lambda$ is a penetration depth over which the external field H at the core of a vertex penetrates into the TSC 200.

The third term on the right side of EQ. 1 relates to the time-dependent thermal force resulting from the hot spot. $\gamma$ is the thermal force coefficient. The energy of a vortex 315 decreases as a function of the temperature T due to the weakening of superconductivity. For a strongly type-II superconductor ($\lambda \gg \xi$), the vortex energy is proportional to the density of Cooper pairs and grows linearly with $T_c - T$, where $T_c$ is the superconducting critical temperature.

The thermal force coefficient $\gamma$ may be determined based on the following equation:

$$\gamma = \frac{\Phi_0^2}{4\pi \mu_0 \lambda_0^2} \ln\left(\frac{\lambda_0}{\xi_0}\right) \frac{1}{T_C} \quad (3)$$

where $\lambda_0$ and $\xi_0$ are the values of $\lambda$ and $\xi$ at zero temperature, respectively.

In EQ. 1, T(x−vt) is the temperature profile of the hotspot. In some aspects, the profile may be determined using a two-layer heat diffusion model using one or more assumptions. For example, the following assumption may be used (i) a thin superconducting layer is grown on top of an infinitely thick substrate and (ii) the superconducting layer is subject to an optical heating source of diameter $D_0$ moving with a constant speed v. This calculation gives a hot-spot temperature profile with a single maximum $\Delta T$ (with respect to the bulk temperature) and a characteristic length scale $D \sim D_0$.

In some aspects, EQ. 1 may be rewritten in terms of certain dimensionless parameters as follows:

$$\dot{\tilde{x}} = \alpha f_p(\tilde{x}) + \beta f_{th}\left(\frac{\tilde{x}-\tilde{t}}{\tilde{D}}\right) \quad (4)$$

where $\tilde{x} = x/d$ is a dimensionless vortex position, $\tilde{t} = vt/d$ is a dimensionless time (where v is the hot-spot speed), $\tilde{D} = D/d$ is the dimensionless hot-spot size, while $\alpha \sim U_0/(d\eta v)$ and $\beta \sim \gamma \Delta T/(d\eta v)$ are dimensionless ratios of the maximal pinning and thermal forces to the viscous drag force at the hot-spot speed v, respectively.

$f_p$ and $f_{th}$ are dimensionless functions. In some aspects, these functions may be antisymmetric. For example, $f_{p,th}(-z)=-f_{p,th}(z)$, have a single zero, $f_{p,th}(0)=0$, a single maximum, $f_{p,th}(-1)=1$, and a single minimum, $f_{p,th}(1)=-1$. The pinning potential may have any Lorentzian shape while the temperature profile may resemble a gaussian shape. The function is not limited to the above and the function may have other characteristics.

For depinning and pinning, the question is whether the vortex 315 is trapped by the pinning site or carried away by the laser beam (hot spot). A dimensionless excess thermal force $\delta$ is defined as $\beta-\alpha$. In an aspect of the disclosure, the vortex 315 always ends up at the pinning site for $\delta \equiv \beta-\alpha < 0$ and at the hot spot for $\delta > 1$. In other words, when $\alpha > \beta$ the vortex is necessarily trapped by the pinning site and the vortex is necessarily carried away by the hot spot if $\beta > \alpha + 1$.

When $0 < \delta < 1$, whether the vortex 315 is trapped by the pinning site or necessarily carried away by the hot spot may be based on the dimensionless hot-spot size $\tilde{D}$. A critical value is defined as $\delta_c$ such that, regardless of its initial condition, the vortex 315 ends up at the pinning site for $\delta < \delta_c$ and at the hot spot for $\delta > \delta_c$. When $\tilde{D} \gg 1$ and $\tilde{D} \ll 1$, the critical values are $\delta_c \ll 1$ and $\delta_c \approx 1$, respectively.

Figure 6:
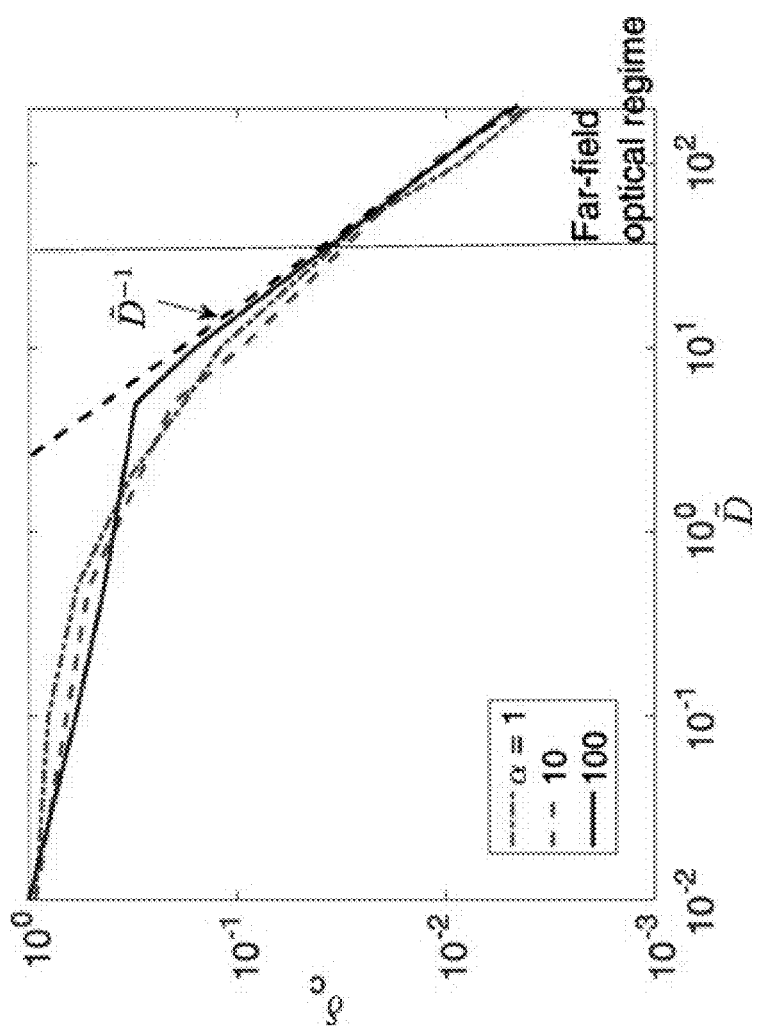
FIG. 6 illustrates $\delta_C$, a dimensionless excess thermal value (critical value), as a function of a dimensionless hot-spot size D in accordance with aspects of the disclosure.

FIG. 6 shows $\delta_c$ (at which the vortex 315 is carried away by the hot spot rather than being trapped by the pinning site) of the dimensionless excess thermal as a function of the dimensionless hot-spot size $\tilde{D}$. Three different curves are show for different pinning forces $\alpha=100, 10, 1$. The $\delta_c$ is not significantly impacted by the change in $\alpha$. The fourth line labeled $\tilde{D}^{-1}$ is an asymptotic trend line. This line shows that at large D, $\delta_c$ is proportional to $\tilde{D}^{-1}$ regardless of the value of $\alpha$. In the $\tilde{D} \gg 1$ limit, the drag force is negligible, and the fate of the vortex 315 is determined by the balance of the maximal pinning and thermal forces. Therefore, the critical condition simply reduces to $\beta-\alpha$. In the $\tilde{D} \ll 1$ limit, the drag force takes a constant value, corresponding to the hot-spot speed, and maximally supports the pinning force against the thermal force.

For dragging the vortex 315, $\beta$ may be greater than 1. This is because there is no pinning force (e.g., first term in the right handle side of equation 1 is zero). As such, the maximal thermal force must exceed the viscous drag force at the hot-spot speed.

Figures 7A, 7B:
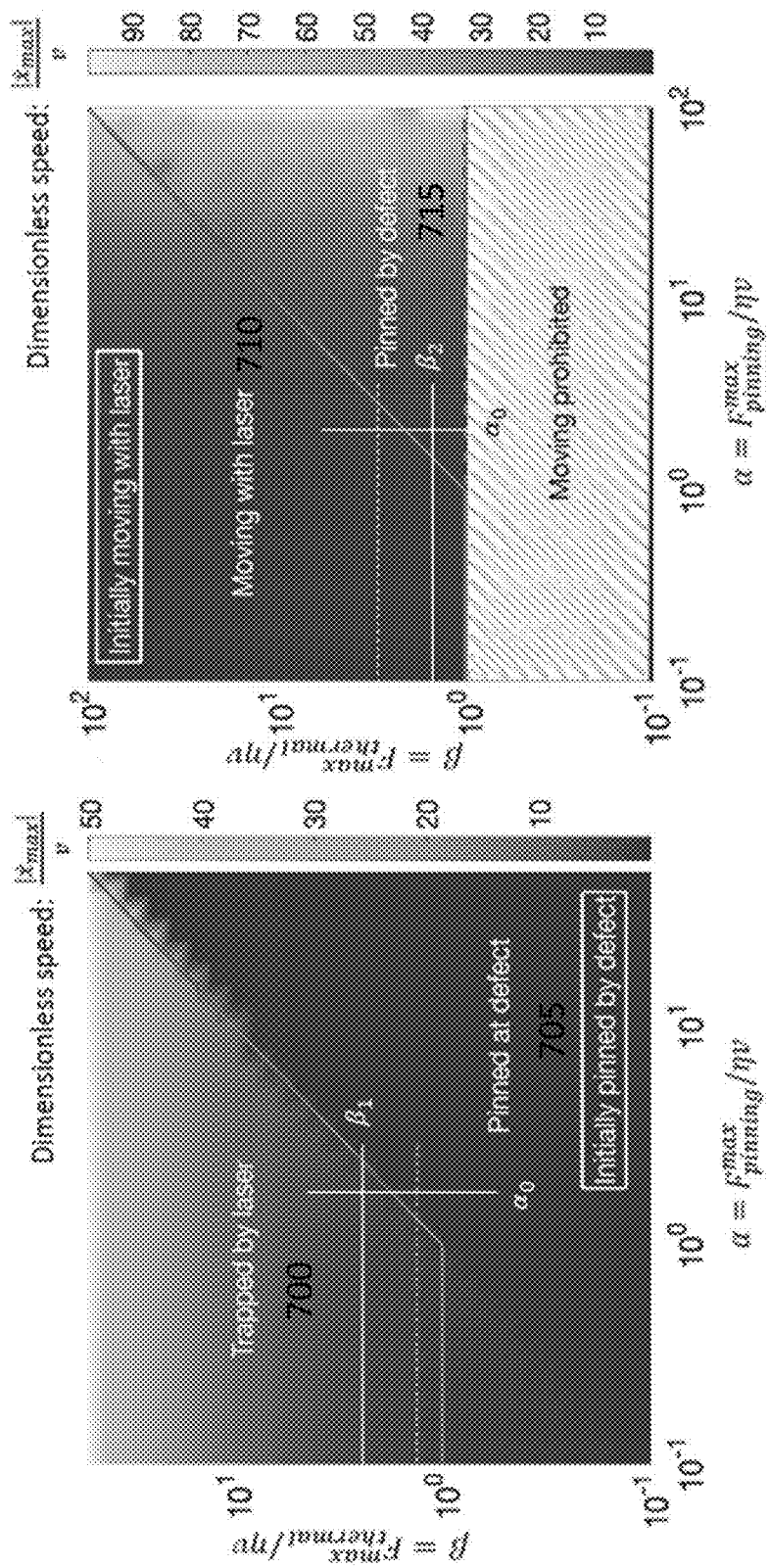
FIGS. 7A and 7B illustrate a relationship between $\alpha$ and $\beta$ and the motion of a vortex for depinning, dragging and pinning in accordance with aspects of the disclosure.

FIG. 7A shows a relationship between $\alpha$ and $\beta$ and motion of the vortex 315. In FIG. 7A, the vortex 315 is pinned (at an initial position) such as at a defect 210. When a greater than $\beta$, the vortex 315 remains pinned. However, when $\beta$ exceeds $\alpha$ (when the vortex 315 is originally at the pinning site), it can be picked up by the hot spot (laser beam) and trapped, such that the maximum thermal force exceeds the maximum pinning force. For example, when $\alpha=\alpha_0$, the thermal force for depinning may be $\beta_1$. The red line in FIG. 7A, represents the boundary for $\alpha$ and $\beta$ for the vortex 315 to be pinned at the defect (pinning site) (area shown as 705) or trapped by the laser beam (area shown as 700) so the vortex 315 can be moved away from the pinning site. The right side of FIG. 7A also shows a legend for the dimensionless speed of the vortex. As $\beta$ increases for a given $\alpha$, the speed of the vortex will increase. As can be seen in FIG. 7A, below a $\beta$ of $10^0=1$ at any $\alpha$, the vortex 315 is pinned at the defect (area shown as 705). This is because as noted above, for $D \ll 1$, the difference between $\alpha$ and $\beta$ may be about 1 for movement from a pinned site.

As noted above, $\beta > 1$ so that the thermal force can keep the vortex 315 trapped while moving the vortex 315 away from the pinning site.

FIG. 7B shows a relationship between $\alpha$ and $\beta$ and motion of the vortex where the vortex 315 is initially moving with the hot spot (laser beam) (area represented as 710). Since the vortex 315 is initially moving with the laser beam, $\beta > 1$, the vortex 315 can then be delivered to, and re-pinned at, the pinning site if $\alpha > \beta$ so the maximal pinning force exceeds the maximal thermal force. For example, when $\alpha=\alpha_0$, the thermal force for delivering the vortex 315 to, and pinning it at, the pinning site may be $\beta_2$, which is less than $\beta_1$ and less than $\alpha_0$. Movement thus is controlled by varying $\beta$. $\beta$ is a function of the power of the laser source 22. Thus, for depinning, the laser power is increased and subsequently decreased to pin (re-pin). The power of the laser source 22 needed for $\beta_1$ and $\beta_2$ as a function of $\alpha_0$, may be based on the type of material used for the TSC 200.

As can be seen in FIG. 7B, below a $\beta$ of $10^0=1$ at any $\alpha$, the vortex is pinned at the detect 715. This is because as noted above, for $D \ll 1$, the difference between $\alpha$ and $\beta$ may be about 1 for movement from a pinned site. The shading in FIGS. 7A and 7B represents a maximal speed that can occur at a given $\alpha$ and $\beta$ during the movement, i.e., depinning, dragging and pinning.

Figure 8C:
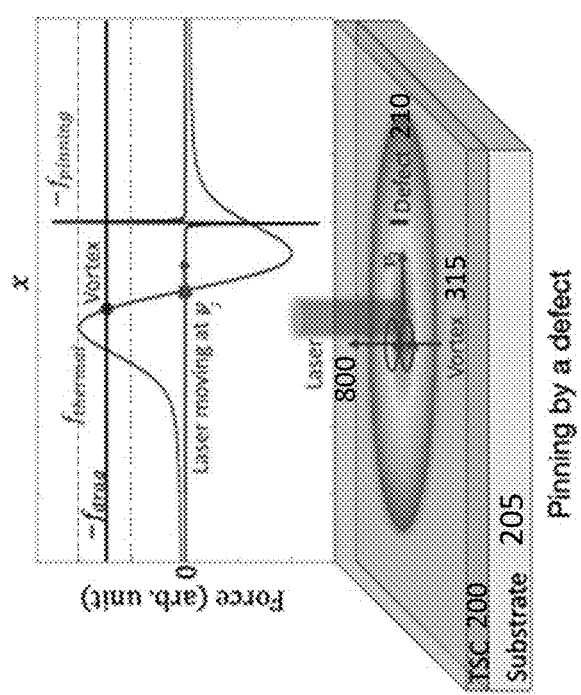

FIGS. 8A-8C illustrate the competing forces for the three different stages (actions) of movement in accordance with aspects of the disclosure. FIG. 8A illustrates the relative strength of the forces $f_{thermal}$ and $f_{pinning}$ for depinning the vortex 315 from a pinning site (defect 210). FIG. 8B illustrates the relative strength of the forces $f_{thermal}$ and $f_{drag}$ for having the vortex 315 travel with the laser beam 800 (hot spot). FIG. 8C illustrates the relative strength of the forces $f_{thermal}$ and $f_{pinning}$ for pinning the vortex at a new pinning site (defect 210).

In each figure (FIGS. 8A-8C), the laser beam 800 (hot spot) is shown as a cylinder. The laser beam 800 may be moving at different speeds in each figure. FIG. 8A illustrates the laser beam 800 before reaching the defect 210 (vortex 315) for depinning. In the example shown in FIG. 8A, a maximal time-dependent thermal $f_{thermal}$ of ~4.5 arb. units (a.u.) at the beam 800 is greater than a pinning force $f_{pinning}$ of ~2.5 a.u. Therefore, when the laser source 22 is controlled to overlap the laser beam with the defect 210 (vortex 315) at this power, the $f_{thermal}$ will be sufficient to depin the vortex 315 from the pinning site (defect 210). The thermal force has a larger length scale than the pinning potential, e.g., by 10× larger. Further, in this example, the depinning speed of the beam 800 is denoted $v_1$.

FIG. 8B illustrates the vortex 315 trapped by the laser beam 800 (hot spot) and travelling with the same. Here, the beam 800 and the laser beam-trapped vortex 315 travel at an intermediate speed $v_2$. In some implementations, the maximal thermal force $f_{thermal}$ for moving the vortex is reduced from the maximal thermal force $f_{thermal}$ for depinning the vortex 315, while keeping the intermediate speed $v_2$ the same as the depinning speed $v_1$. In some implementations, the intermediate speed $v_2$ is reduced from the depinning speed $v_1$, while keeping the maximal thermal force $f_{thermal}$ for moving the vortex 315 the same as the maximal thermal force $f_{thermal}$ for depinning the vortex 315. In some implementations, both the intermediate speed $v_2$ and the maximal thermal force $f_{thermal}$ for moving the vortex 315 are each correspondingly reduced from the depinning speed $v_1$ and the maximal thermal force $f_{thermal}$ for depinning the vortex 315. The latter implementation is illustrated in the example shown in FIG. 8B, where a maximal thermal force $f_{thermal}$ of ~3.5 a.u. is higher than a drag force $f_{drag}$ of ~3.2 a.u. at the position of the vortex. Here, the value of the intermediate speed $v_2$ dictates a value of the drag force $f_{drag}$.

FIG. 8C shows the position of the laser beam 800 just before reaching the pinning site (defect 210). Here, the beam 800 and the laser beam-trapped vortex 315 travel at a pinning speed $v_3$. In some implementations, the maximal thermal force $f_{thermal}$ for pinning the vortex 315 is reduced from the maximal thermal force $f_{thermal}$ for moving the vortex 315, while keeping the pinning speed $v_3$ the same as the intermediate speed $v_2$. In some implementations, the pinning speed $v_3$ is reduced from the intermediate speed $v_2$, while keeping the maximal thermal force $f_{thermal}$ for pinning the vortex 315 the same as the maximal thermal force $f_{thermal}$ for moving the vortex 315. In some implementations, both the pinning speed $v_3$ and the maximal thermal force $f_{thermal}$ for pinning the vortex 315 are each correspondingly reduced from the intermediate speed $v_2$ and the maximal thermal force $f_{thermal}$ for moving the vortex 315. The latter implementation is illustrated in FIG. 8C, where a maximal thermal force $f_{thermal}$ of ~2 a.u. is now less than the pinning force $f_{pinning}$ of ~2.5 a.u. As described above, the reduction in the thermal force $f_{thermal}$ is to allow the vortex 315 to be pinned at the new site, e.g., $\beta_2$ is less than $\beta_1$. Additionally in FIG. 8C, a value of the drag force $f_{drag}$. ~1.5 a.u. is smaller than the value of the drag force $f_{drag}$ in FIG. 8B because here it is dictated by the smaller value of the pinning speed $v_3$. Note that the speeds $v_1$, $v_2$, and $v_3$ can have values in a range of 0.5 cm/s to 5 cm/s.

In summary, in each of FIGS. 8A-8C, the thermal force is lower as the distance of the laser beam 800 increases.

While changing $\beta$ relative to a enables the movement described herein and changing $\beta$ may be accomplished by changing the power of the laser source 22 (or spot size), in an aspect of the disclosure, $\beta$ and $\alpha$ may be close to each other to minimize the amount of tuning and disruption. As such, in an aspect of the disclosure, a material used for the TSC 200 may have a relatively large coherence length. For example, the coherence length may be greater than 10 nm. In other aspect, $\alpha$ may be tuned by electrically gated pinning sites.

In some aspects of the disclosure, $\beta$ may be controlled to control a maximum speed of the vortex 315 as it is dragging through the TSC 200. This is done to maximize the topological protection of the MZM and avoid diabatic errors.

As described above, once vortices 315 have been initialized, the vortices 315 may be read by one or more readout modules 900. The vortices 315 may be read by moving two of the vortices 315 near a readout module 900 and in close proximity to each other such as by the movement described above including depinning (as shown in FIG. 8A) and dragging (as shown in FIG. 8B).

The one or more readout modules 900 may be positioned within the cryo-unit or cryo-chamber. In some aspects of the disclosure, the readout module 900 may be positioned on the same substrate 205 as the TSC 200. A readout module 900 may include a quantum dot. The readout module 900 can measure a local fermionic orbital defined by the two vortices 315 (MZMs) and a fermionic occupancy thereof. When two vortices 315 are brought close to the quantum dot 901 by the exchange module 20 (movement module), a tunnel junction is formed. The quantum dot may be subject to a Coulomb blockade by supplying a small bias voltage If, as result of the measurement, an electron occupies the local fermionic mode then the coulomb blockade is observed. If the fermionic orbital is unoccupied then the current is not impeded as there is no Coulomb blockade.

Figure 9:
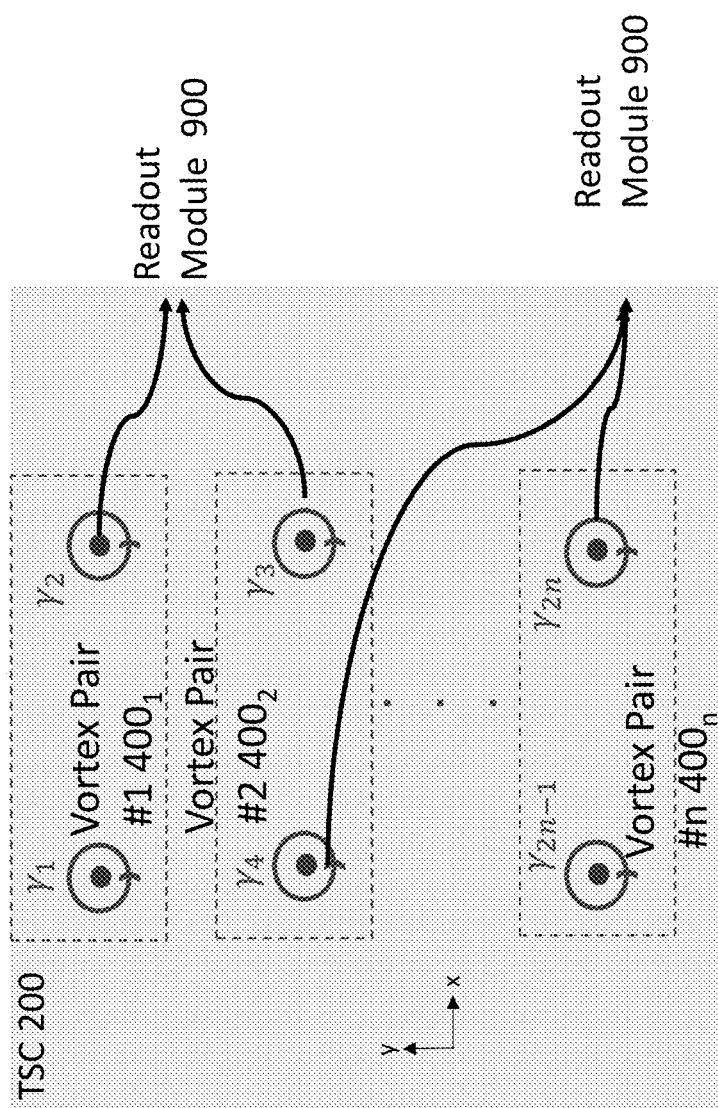
FIG. 9 illustrates an example of reading out Majorana zero modes in accordance with aspects of the disclosure.

FIG. 9 illustrates two examples of moving vortices for readout by a readout module 900. In the first example, two vortices $\gamma_2$, $\gamma_3$ are moved adjacent to the readout module 900. In this example, $\gamma_2$, $\gamma_3$ can be "fused" into an uncharged state (vacuum state) or a charged state. The readout module 900 is able to detect the state via quantum dot parity detection. Here, for example, $\gamma_2$, $\gamma_3$ form a charged state. In the second example, $\gamma_4$, $\gamma_{2n}$ are moved adjacent to the readout module 900 for the latter to read out, e.g., by fusing the $\gamma_4$, $\gamma_{2n}$. Here the result is an uncharged state. The vortices 315 selected for fusing may be randomly selected for initial readout (e.g., after initialization of vortices $\gamma_1$, $\gamma_2$, $\gamma_3$, $\gamma_4$, ..., $\gamma_{2n}$, $\gamma_{2n-1}$) as long as the same vortex is not selected twice. At the readout position, the movement paths of the vortices may be parallel to each other.

Figure 10:
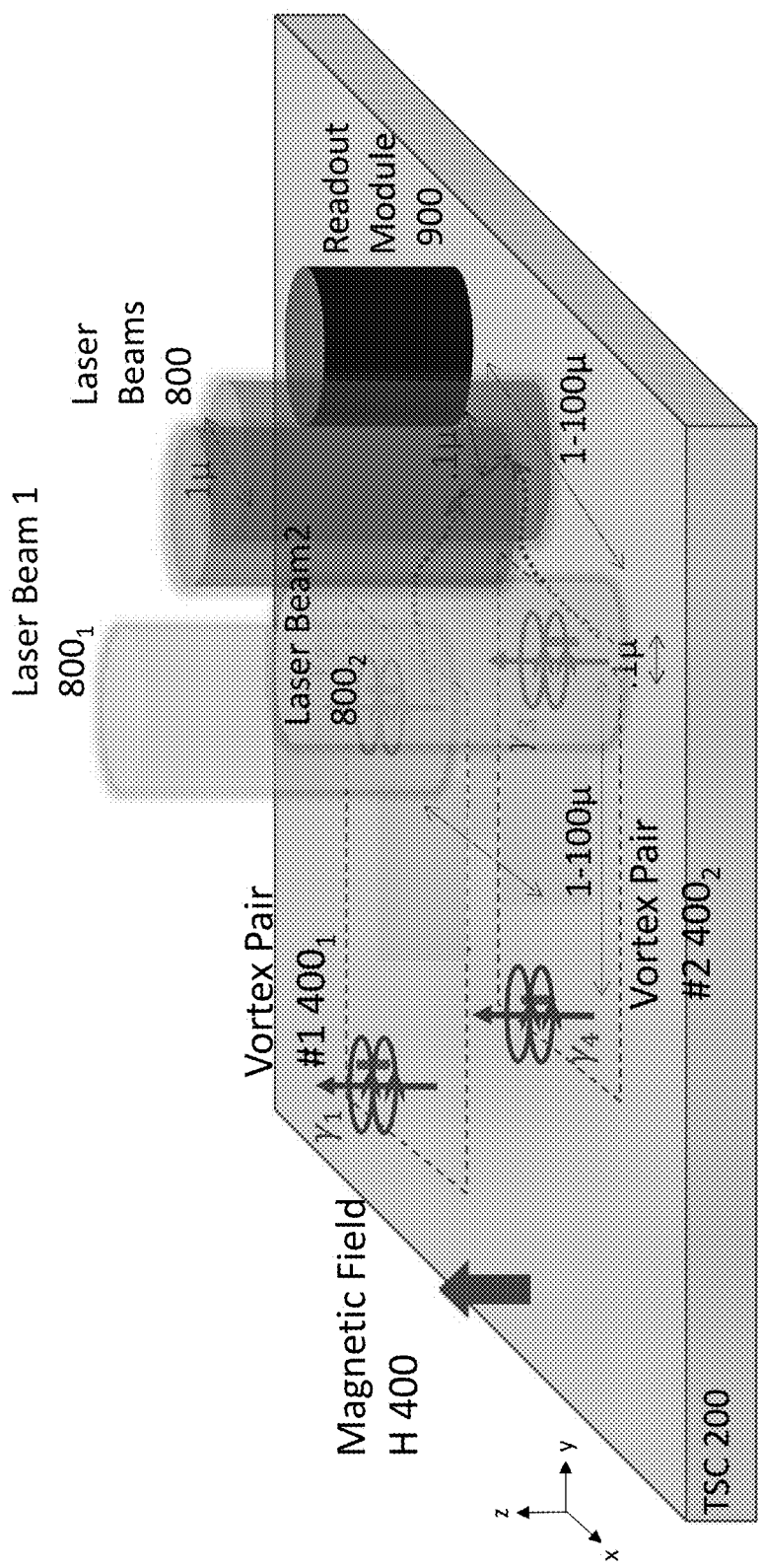
FIG. 10 illustrates an example of moving two of Majorana zero modes to read the two in accordance with aspects of the disclosure.

FIG. 10 illustrates an example of moving vortices $\gamma_2$, $\gamma_3$ for readout by the readout module 900. In order to move the vortices $\gamma_2$, $\gamma_3$, the laser beams $800_{1,\,2}$ must be steered by the beam steering submodule 24 to the vortex position of 2, $\gamma_3$. The vortex position may be known by imaging as described above. When the laser beams $800_{1,\,2}$ are at the vortex position (as shown in FIG. 10) (aligned), the vortices $\gamma_2$, $\gamma_3$ can be depinned from their respective defects 210, e.g., maximal time-dependent thermal $f_{thermal}$ at the beams $800_{1,\,2}$ are greater than the pinning force $f_{pinning}$, as explained above in connection with FIG. 7A and FIG. 8A. The laser beams $800_{1,\,2}$ are then steered towards the readout module 900 through the TSC 200 using the beam steering submodule 24. An example of the paths for the laser beams $800_{1,\,2}$ is shown in FIG. 10 by dotted lines. The vortices $\gamma_2$, $\gamma_3$ are trapped and carried away by the laser beams $800_{1,\,2}$, e.g., maximal thermal force $f_{thermal}$ is higher than the drag force $f_{drag}$, as explained above in connection with FIG. 8B.

The laser beams $800_{1,\,2}$ are steered by the steering submodule 24 such that the vortices $\gamma_2$, $\gamma_3$ are brought close to each other and fused and also close to the readout module 900 to form the tunnel junction. FIG. 10 illustrates the laser beams $800_{1,\,2}$ proximate to the readout module 900. Laser beams $800_{1,\,2}$ overlap each other such that the vortices $\gamma_2$, $\gamma_3$ are brought close to each other to a distance of order the size of a vortex. Once a state of the two vortices 315 is detected by the readout module 900, the vortices $\gamma_2$, $\gamma_3$ may be returned to their initial position, e.g., the defects. Returning each vortex 315 to its initial position may use a different path than the path used to drag the vortex to the readout site. There is no need to pin the vortices 315 of a pair at another defects 210 in order to detect a state of the vortices 315.

In accordance with aspects of the disclosure, fermionic parity is the measurable quantity and total fermionic parity constrains a last vortex-pair readout as noted above. As a consequence 2(n+1) vortices 315 are also to span a n-qubit space.

In an aspect of the disclosure, the beam steering submodule 24 may also be used for physically braiding the vortices 315 to generate one or more quantum computation gates. Braiding may be accomplished by changing the position of vortices 315. For example, two vortices may be switched. This may provide a 2-qubit quantum gate. In other aspects of the disclosure, the positions of more than two vortices 315 may be changed to provide an m-qubit quantum gate. In other aspects of the disclosure, a vortex 315 may be moved and wrapped around another and then returned to their original positions.

Fermionic exchange is a consequence of the fermionic canonical commutation relations algebraically describing of the fermionic creation ($c^+$) and annihilation (c) operators $\{c_i, c_j\}=0$, $\{c_i^+, c_j\}=\delta_{ij}$, $\{c_i^+, c_j^+\}=0$. Fermionic gates, acting in a fermionic basis spanned by anti-symmetric field operators, enable universal fermionic quantum computation. In this analogy local fermionic modes are equivalent to qubits and single- and multi-qubits, alternatively fermions, form unitary gate operations.

Fermionic field operators can be decomposed into their real and imaginary Majorana quadratures as $c=(\gamma_1+i\gamma_2)$, $c^+=(\gamma_1-i\gamma_2)$ (in analogy to the transformation between ladder operators and quadrature operators for bosonic systems, where $\gamma_1$, $\gamma_2$ represent example of two MZMs) which obey the Clifford anti-commutation relations $\{\gamma_i, \gamma_j\}=2\delta_{ij}$. Consequently $\gamma_i\gamma_j=-\gamma_j\gamma_i$ if $i\neq j$ and $$\gamma_i^2 = \frac{1}{2}.$$

For minimal fermion gates, two fermions, e.g., $c_1$, $c_2$ may be required. The two fermions may be decomposed into four Majorana operators, e.g., $\gamma_1$, $\gamma_2$, $\gamma_3$, $\gamma_4$ which realize an su(2) algebra with $\{i\gamma_1\gamma_2, i\gamma_1\gamma_3, i\gamma_2\gamma_3\}$ behaving like $\{\sigma^z, \sigma^y, \sigma^x\}$.

Thus, in accordance with aspects of the disclosure, different quantum computations gates, such as a phase gate (S-gate) or a CNOT gate (Hadamard) may be created. These gates are just examples and the types of gates formed are not limited to these examples.

Figure 11:
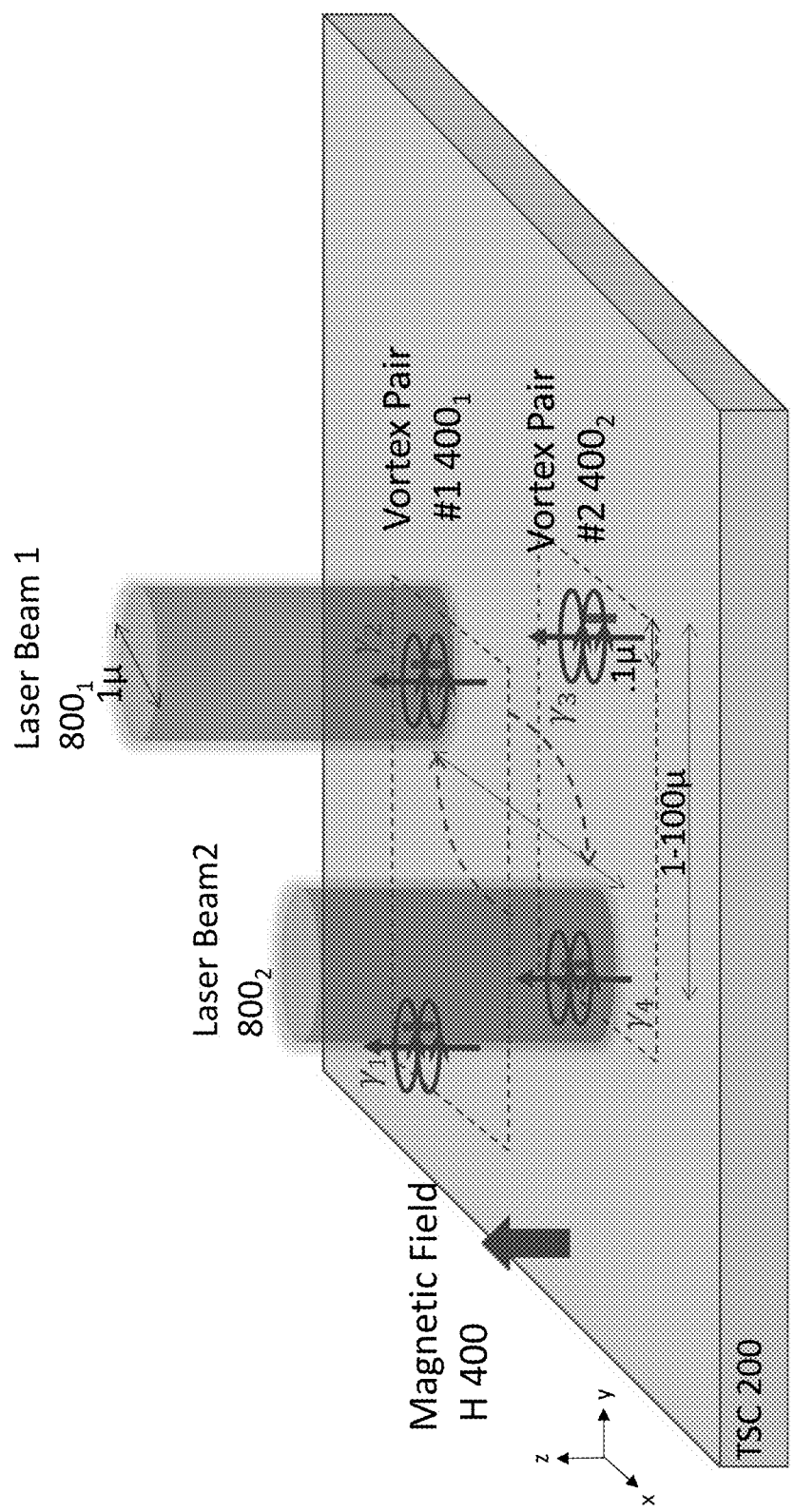
FIG. 11 illustrates an example of a braiding operation in accordance with aspects of the disclosure.

FIG. 11 illustrates an example of a braiding operation. In this example, two vortices $\gamma_2$, $\gamma_4$ are exchanged Vortex $\gamma_2$ is depinned from its initial defect 210 and dragged through the TSC 200 and re-pinned at vortex $\gamma_4$ initial position. At the same time, vortex $\gamma_4$ is depinned from its initial defect 210 and dragged through the TSC 200 and re-pinned at vortex $\gamma_2$ initial position. This may be accomplished by the beam steering submodule 24. Two laser beams $800_{1,2}$ are steered by the steering submodule 24 such they reach the initial positions of the two vortices $\gamma_2$, $\gamma_4$. When the laser beams $800_{1,2}$ are at the vortices position (as shown in FIG. 11) (aligned), the vortices $\gamma_2$, $\gamma_4$ can be depinned from the defect 210, e.g., maximal time-dependent thermal $f_{thermal}$ at the beams $800_{1,2}$ are greater than the pinning force $f_{pinning}$ as described above in connection with FIG. 7A and FIG. 8A. Vortices $\gamma_2$, $\gamma_4$ can be braided around each other by dragging the vortices though the TSC 200. The vortices $\gamma_2$, $\gamma_4$ are trapped and carried away by the laser beams $800_{1,2}$, e.g., maximal thermal force $f_{thermal}$ is higher than the drag force $f_{drag}$, as described above in connection with FIG. 8B Laser beams $800_{1,2}$ can move the vortices $\gamma_2$, $\gamma_4$ along a path such that the vortices pass each other as they are moved. The vortices $\gamma_2$, $\gamma_4$ may be re-pinned at the other vortices initial position using the laser beams $800_{1,2}$, as described above in connection with FIG. 7B and FIG. 8C. In the depinning, dragging and re-pinning, the laser source 22 power may be adjusted as shown in FIGS. 7A, 7B, 8A, 8B, 8C as needed.

The example shown in FIG. 11 is a way to create an S-gate. For example, dragging $\gamma_2$ around $\gamma_4$ mathematically maps $\gamma_2 \to \gamma_4$, $\gamma_4 \to -\gamma_2$, thus the S-gate can simply be implemented by braiding $\gamma_2$ around $\gamma_4$ $\gamma_1$ and $\gamma_3$ are not moved.

A CNOT gate may be implemented using a series of braiding operations using three or more vortices 315. With a CNOT gate, the same vortex may be braided with multiple different vortices 315. Braiding the vortices to create a CNOT gate is shown in an article entitled "Braiding Majorana Fermions and Creating Quantum Logic Gates with Vortices On a Periodic Pinning Structure", Ma et al. published 2019. The contents of which are incorporated by reference.

Figure 12:
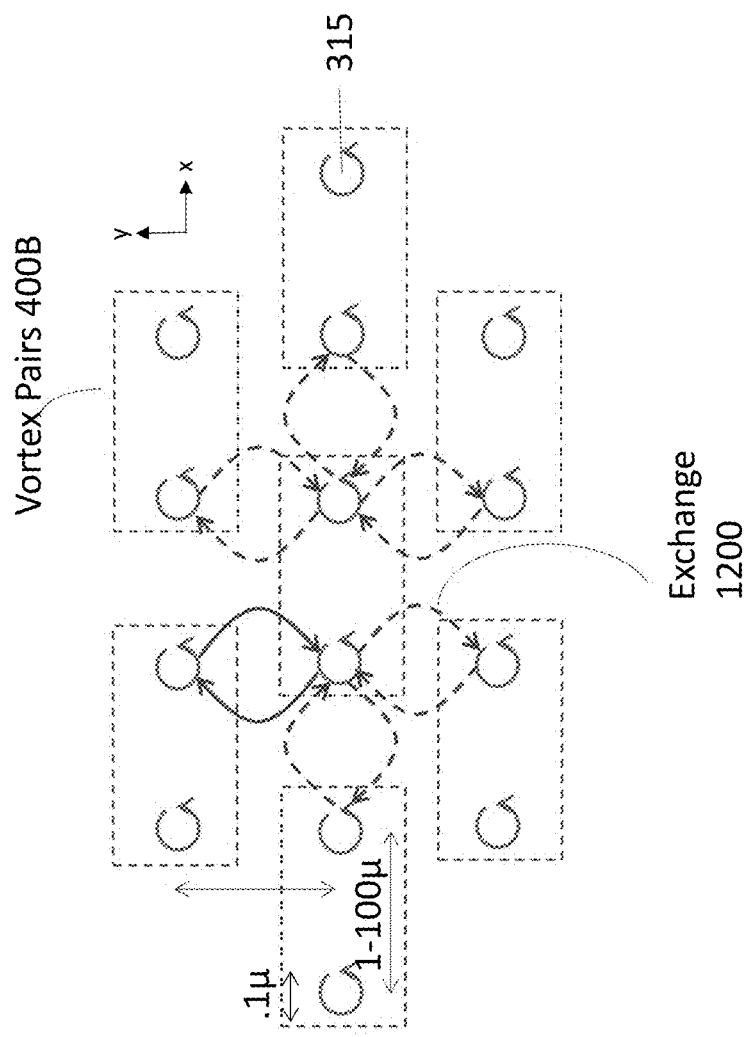
FIG. 12 illustrates examples of exchanging vortices from defect positions in accordance with aspects of the disclosure.

FIG. 12 illustrates other examples of exchanges 1200 of vortices 315. The position of vortices 315 of one or more vortices may be changed or exchanged.

In accordance with aspects of the disclosure, the same controller may control the laser source 22, the beam steering submodule 24 and the magnetic flux source 34 (generation of the magnetic field for initialization). This controller may be included in a controller based on the classical computation 100. The controller 100 may comprise the processor and memory. In other aspects of the disclosure, multiple different controllers may be used to respectively control the laser source 22, the beam steering submodule 24 and the magnetic flux source 34. Each controller may comprise a processor and a memory. These controllers may be internal to the respective modules (sub-modules). In this aspect of the disclosure, the controllers in the respective modules may be electrically coupled to the controller 100.

For example, the controller 100, prior to any computation (classical computation), may issue an initialization signal (I) to create a plurality of vortices 315. The initialization signal (I) may be sent to a controller to control the flux source 34. In an aspect of the disclosure, the initialization signal (I) may indicate a target number of vortices. In other aspects, the initialization signal (I) may omit the target number and indicate a magnetic field strength. In other aspects of the disclosure, the initialization signal (I) may be an instruction to turn on the current source (ON/OFF) (without any target or field strength). In response to the receipt of the signal, a controller may control the flux source 34 to turn on to generate the vortices as described above.

The TSC 200 may be imaged to determine the position and number of created vortices 315. In an aspect of the disclosure, the position and number may be transferred to the controller 100. In an aspect of the disclosure, in response to receipt of the position and number, the controller 100 may issue an instruction to the exchange module 20 (Exchange Signal E and Read Command R) and the readout module 900 (Read Command R) to read the vortices to determine the fermionic parity. The exchange module 20 may be controlled by a controller as described above to move the vortices to fuse them and move them to the readout module 900 for reading. The read signals RR may be transfer to the controller 100. In an aspect of the disclosure, the readout module 900 may collects the readings from all of the fused two vortices, prior to transfer to the controller 100. In this aspect, the readout module 900 may also comprise a memory such as a buffer. In other aspects, the readout module 900 may transfer each reading to the controller 100 in real time (read signal RR). In some aspects, the controller 100 may select which vortices 315 are fused. In other aspects, a controller in the exchange module 20 may select the vortices 315 randomly.

Once all of the vortices 315 are read, in some aspects, the controller 100 may instruct the exchange module 20 to move 2(n+1) vortices (depin) and drag them to a clean region of the TSC 200 without vortices 315 in order to initialize a computation. This may be done when a number of initialized vortices m>2(n+1) vortices.

At this point, the controller 100 knows the input state and parity (chosen by selecting say an even number of 1s for the even fermionic parity sector). In an aspect of the controller 100 may determine the qubits based on the input state and parity of the vortices, e.g., assignment of vortices to a qubit. In other aspects of the disclosure, the assignment may be random or by location. Once assigned, the assignment may be recorded in storage and the position is noted. Additionally, the vortices may than be tracked as needed. In other aspects, as noted above, the vortices 315 may be assigned to qubits 400 prior to the initial reading.

The controller 100 may execute a computation as required by the quantum algorithm of interest. For example, the controller 100 may instruct the exchange module 20 via exchange signals (E) to braid the vortices 315 as needed to create the quantum gate(s). The controller 100 may instruct the exchange module 20 via exchange signals (E) to move the vortices 315 as needed for measurement-based computation (which is a known computational modality where an entanglement-rich state is "used" by a series of measurements and classical feed forward). In an aspect of the disclosure, the quantum information may be manipulated without braiding in a measurement-based scheme. However, the Majoranas still needs to be selected and fused for readout). Additionally, after braiding (or for measurement-based computations), the controller 100 may also include the readout module 900 to readout the vortices 315 of interest. As noted above, to read the vortices, the controller may instruct the exchange module 20 via exchange signals (E) to move the vortices 315 close to the readout module 900 and each other.

Various aspects of the present disclosure may be embodied as a program, software, or computer instructions embodied or stored in a computer or machine usable or readable medium, or a group of media which causes the computer or machine to perform the steps of the method when executed on the computer, controller, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electromagnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The controller(s) described herein, e.g., a hardware processor, may be a central processing unit (CPU), a graphics processing unit (GPU), a field programmable gate array (FPGA), an application specific integrated circuit (ASIC), another suitable processing component or device, or one or more combinations thereof. The storage(s) may include random access memory (RAM), read-only memory (ROM) or another memory device, and may store data and/or processor instructions for implementing various functionalities associated with the methods and/or systems described herein.

In the description and claims herein, the term "about" indicates that the value listed may be somewhat altered, as long as the alteration does not result in nonconformance of the process or device. For example, for some elements the term "about" can refer to a variation of ±0.1%, for other elements, the term "about" can refer to a variation of ±1% or ±10%, or any point therein. For example, the term about when used for a measurement in mm, may include +/0.1, 0.2, 0.3, etc., where the difference between the stated number may be larger when the state number is larger. For example, about 1.5 may include 1.2-1.8, where about 20, may include 19.0-21.0.

The terminology used herein is for the purpose of describing particular aspects only and is not intended to be limiting the scope of the disclosure and is not intended to be exhaustive. Many modifications and variations will be apparent to those of ordinary skill in the art without departing from the scope and spirit of the disclosure.

What is claimed is:

1. A quantum processing device comprising:
a type II superconducting medium comprising a plurality of defects;
a magnetic flux source configured to produce, during operation of the quantum processing device, a magnetic flux that induces, within the type II superconducting medium, vortices pinned at locations of some of the defects, such that the vortices are separated from each other based on a vortex distribution, wherein two or more vortices are used to enact quantum computational gates of the quantum processing device;
a laser source configured to provide two or more laser beams with controllable power; and
a beam-steering module configured to
redirect the two or more laser beams to departure locations of two or more vortices while the two or more laser beams are provided with a first power that causes unpinning of the two or more vortices from the departure locations, respectively, and allows the two or more laser beams to drag the unpinned vortices through the type II superconducting medium,
sweep the two or more laser beams along respective paths from the departure locations to destination locations of the two or more vortices, and
redirect the two or more laser beams to the destination locations while the two or more laser beams are provided with a second power smaller than the first power that causes pinning of the dragged vortices.

2. The quantum processing device of claim 1, wherein the magnetic flux source comprises at least one wire and corresponding current source, wherein a magnitude of the magnetic flux is controllable based on a target number of vortices and the vortex distribution.

3. The quantum processing device of claim 1, wherein the magnetic flux source comprises a plurality of wires and corresponding current sources, each current source is independently controllable, wherein the plurality of wires is positioned with respect to the type II superconducting medium to produce an asymmetric magnetic flux within the type II superconducting medium.

4. The quantum processing device of claim 1, further comprising material positioned over the type II superconducting medium and a device configured to determine a position and number of the vortices within the type II superconducting medium and transfer the position and number to a processor.

5. The quantum processing device of claim 1, wherein the beam-steering module is configured to enact one or more quantum computational gates by braiding two or more vortices.

6. The quantum processing device of claim 5, wherein the beam-steering module is configured to:
 redirect a first laser beam to a first location of a first vortex and a second laser beam to a second location of a second vortex while the first and second laser beams are provided with the first power,
 sweep the first laser beam along a first path from the first location to the second location and the second laser beam along a second path from the second location to the first location, and
 redirect the first laser beam to the second location and the second laser beam to the first location while the first and second laser beams are provided with the second power.

7. The quantum processing device of claim 5, wherein the beam-steering module is configured to:
 redirect a laser beam to a location of a first vortex, sweep a power of the laser beam to depin the first vortex,
 sweep the laser beam along a loop-shaped path from the location of the first vortex encircling a second vortex a single time and back to the location of the first vortex and ramping the power down to repin the first vortex.

8. The quantum processing device of claim 5, further comprising a processor configured to instruct the beam-steering module to enact the one or more quantum computational gates based on a computation.

9. The quantum processing device of claim 1, wherein the laser source comprises a laser and a plurality of beam splitters to provide the two or more laser beams.

10. The quantum processing device of claim 1, wherein the beam-steering module is configured to move the two or more laser beams at speeds of in a range of 0.5-5.0 cm/s.

11. The quantum processing device of claim 1, wherein each vortex has a spin orbit of about 0.1 μm in diameter and wherein the two or more lasers beams have a beam width of about 1 μm in diameter.

12. The quantum processing device of claim 1, wherein the vortex distribution is such that adjacent vortices are separated by about 1 μm to about 100 μm.

13. The quantum processing device of claim 1, wherein the type II superconducting medium is a superconducting film disposed on a substrate.

14. The quantum processing device of claim 13, wherein the magnetic flux source comprises at least one wire, wherein the at least one wire is disposed on the substrate.

15. The quantum processing device of claim 13, wherein the superconducting film comprises mixtures of Fe with one or more heavy elements.

16. The quantum processing device of claim 15, wherein the mixtures of Fe with one or more heavy elements comprise Fe(Te,Se), and
 the substrate comprises $SrTiO_3$.

17. The quantum processing device of claim 15, wherein the superconducting film comprises Cu—$Bi_2Se_3$, and
 the substrate comprises InP.

18. The quantum processing device of claim 14, wherein the superconducting film comprises BiPd, and
 the substrate comprises $Al_2O_3$.

19. The quantum processing device of claim 1, wherein the type II superconducting medium is part of a $NbSe_2$/$Bi_2Se_3$ heterostructure.

20. The quantum processing device of claim 1, wherein the beam-steering module is further configured to redirect two laser beams to departure locations of two vortices while the two laser beams are provided with the first power that causes unpinning of the vortices from the departure-locations, respectively, and allows the two laser beams to drag the unpinned vortices through the type II superconducting medium toward a readout module and each other to cause fusing of the two vortices for readout and return the two vortices to respective departure locations after readout, where the two vortices comprise a first vortex carrying a first Majorana-zero-mode (MZM) and a second vortex carrying a second MZM, the first vortex moving over a first path and the second vortex moving over a second path, the first path and the second path running parallel to each other over a readout location.

21. The quantum processing device of claim 20, further comprising a readout module, the readout module comprising a Coulomb-blockade based quantum dot sensor, wherein when the first vortex and the second vortex are adjacent to the quantum dot, a tunnel junction is formed and the readout module detects whether a pair of the first MZM and the second MZM are in a vacuum state or a charged state.

22. A quantum processing device comprising:
 a type II superconducting medium comprising a plurality of defects;
 a magnetic flux source configured to produce, during operation of the quantum processing device, a magnetic flux that induces, within the type II superconducting medium, vortices pinned at locations of some of the defects, such that the vortices are separated from each other based on a vortex distribution, wherein two or more vortices are used to enact quantum computational gates of the quantum processing device;
 a laser source configured to provide a laser beam with controllable power; and
 a beam-steering module configured to
  redirect the laser beam to a departure location of a vortex while the laser beam is provided with a first power that causes unpinning of the vortex from the departure location,
  sweep the laser beam along a path from the departure location to a destination location, and
  redirect the laser beam to the destination location while lowering the power from the first power to a second power to cause pinning of the vortex.

23. The quantum processing device of claim 22, wherein the departure location is the same as the destination location.

24. The quantum processing device of claim 23, wherein the path comprises encircling another vortex a single time.

* * * * *